United States Patent
Shimoju et al.

(10) Patent No.: US 12,242,185 B2
(45) Date of Patent: Mar. 4, 2025

(54) CURABLE COMPOSITION, KIT, INTERLAYER, LAMINATE, IMPRINT PATTERN PRODUCING METHOD, AND METHOD FOR MANUFACTURING DEVICE

(71) Applicant: FUJIFILM Corporation, Tokyo (JP)

(72) Inventors: Naoya Shimoju, Haibara-gun (JP); Akihiro Hakamata, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 175 days.

(21) Appl. No.: 17/890,374

(22) Filed: Aug. 18, 2022

(65) Prior Publication Data

US 2023/0004079 A1    Jan. 5, 2023

Related U.S. Application Data

(63) Continuation of application No. PCT/JP2021/006080, filed on Feb. 18, 2021.

(30) Foreign Application Priority Data

Feb. 20, 2020  (JP) .................................. 2020-026864

(51) Int. Cl.
G03F 7/40   (2006.01)
G03F 7/00   (2006.01)
G03F 7/031  (2006.01)

(52) U.S. Cl.
CPC ............ *G03F 7/0002* (2013.01); *G03F 7/031* (2013.01); *G03F 7/40* (2013.01)

(58) Field of Classification Search
CPC .......... G03F 7/0002; G03F 7/031; G03F 7/40; C09J 171/02; C09J 11/05; C09J 133/14
USPC ........................................................ 523/1
See application file for complete search history.

(56) References Cited

U.S. PATENT DOCUMENTS

| | | | |
|---|---|---|---|
| 2005/0023508 A1* | 2/2005 | Fujimaki ............... | C08L 67/07 252/587 |
| 2011/0003909 A1* | 1/2011 | Fujita .................... | B82Y 10/00 560/95 |
| 2014/0154628 A1* | 6/2014 | Nagoshi ................ | C08G 59/186 430/280.1 |
| 2015/0014819 A1 | 1/2015 | Hattori et al. | |
| 2016/0079082 A1* | 3/2016 | Ojima .................... | G03F 7/0002 428/522 |
| 2019/0264076 A1 | 8/2019 | Tanabe et al. | |
| 2023/0250311 A1* | 8/2023 | Shimoju ............... | G03F 7/0002 438/780 |
| 2023/0383044 A1* | 11/2023 | Hakamata ........... | H01L 21/0273 |

FOREIGN PATENT DOCUMENTS

| | | |
|---|---|---|
| JP | 2013-043894 A | 3/2013 |
| JP | 2013-202982 A | 10/2013 |
| JP | 2018-080260 A | 5/2018 |

OTHER PUBLICATIONS

International Search Report dated Apr. 20, 2021, issued in International Application No. PCT/JP2021/006080.
Written Opinion dated Apr. 20, 2021, issued in International Application No. PCT/JP2021/006080.
International Preliminary Report on Patentability dated Aug. 23, 2022, issued in International Application No. PCT/JP2021/006080.
Office Action issued Aug. 29, 2023 in Japanese Application No. 2022-501961.
Office Action dated Jul. 16, 2024 in Korean Application No. 10-2022-7028511.

* cited by examiner

*Primary Examiner* — Hannah J Pak
(74) *Attorney, Agent, or Firm* — Sughrue Mion, PLLC

(57) ABSTRACT

Provided are a curable composition used for forming an interlayer existing between a base material and a curable layer, the curable composition including a curable main agent having a polymerizable functional group, a polymerization inhibitor, and a solvent, in which a content of the polymerization inhibitor is 1 part by mass or greater and lower than 1,000 parts by mass with respect to 1,000,000 parts by mass of the curable main agent; a kit including the curable composition; an interlayer formed from the curable composition; a laminate including the interlayer; an imprint pattern producing method using the laminate; and a method for manufacturing a device including the imprint pattern producing method.

7 Claims, No Drawings

CURABLE COMPOSITION, KIT, INTERLAYER, LAMINATE, IMPRINT PATTERN PRODUCING METHOD, AND METHOD FOR MANUFACTURING DEVICE

CROSS-REFERENCE TO RELATED APPLICATIONS

This application is a Continuation of PCT International Application No. PCT/JP2021/006080 filed on Feb. 18, 2021, which claims priority under 35 U.S.C § 119(a) to Japanese Patent Application No. 2020-026864 filed on Feb. 20, 2020. Each of the above application(s) is hereby expressly incorporated by reference, in its entirety, into the present application.

BACKGROUND OF THE INVENTION

1. Field of the Invention

The present invention relates to a curable composition, a kit, an interlayer, a laminate, an imprint pattern producing method, and a method for manufacturing a device.

2. Description of the Related Art

An imprinting method is a technique in which a fine pattern is transferred to a material by pressing a metal mold (generally also called a mold or a stamper) on which a pattern is formed. The imprinting method enables simple and precise production of a fine pattern, and thus is expected to be applied in various fields, such as a precision processing field for semiconductor integrated circuits, in recent years. In particular, a nanoimprint technique for forming a fine pattern of a nano-order level is attracting attention.

JP2018-080260A discloses, as a composition used in an imprinting method, an adhesion layer-forming composition to allow a substrate to adhere to a photocurable composition, at least containing a curable main agent (A) having at least one functional group which is bonded to a base material and having at least one radically polymerizable functional group, a polymerization inhibitor (B), and an organic solvent (C), in which the content of the polymerization inhibitor (B) is 0.1 parts by weight or greater and 10 parts by weight or lower with respect to 100 parts by weight of the curable main agent (A).

SUMMARY OF THE INVENTION

As the imprinting method, methods called a thermal imprinting method and a curable imprinting method have been proposed depending on a transfer method. In the thermal imprinting method, for example, a mold is pressed against a thermoplastic resin heated to a temperature equal to or higher than a glass transition temperature (hereinafter, referred to as a "Tg" in some cases), the thermoplastic resin is cooled, and then the mold is released to form a fine pattern. In this method, various materials can be selected, but there are problems in that it is difficult to form a fine pattern, such as the need for high pressure during pressing and the deterioration of dimensional accuracy due to heat contraction.

In the curable imprinting method, for example, while the mold is pressed against a curable layer formed of a composition for forming a pattern, the curable layer is cured by light, heat, or the like, and then the mold is released. Since it is imprinted on an uncured material, it is possible to omit part or all of high-pressure addition and high-temperature heating, and it is possible to easily produce a fine pattern. Moreover, since a dimensional change before and after curing is small, there is also an advantage that a fine pattern can be formed with high accuracy.

Recently, new developments such as a nanocasting method in which the advantages of both the thermal imprinting method and the curable imprinting method are combined, and a reversal imprinting method for producing a three-dimensional laminated structure have also been reported.

Examples of the curable imprinting method include a method in which a curable layer is formed by applying, by a coating or the like, a composition for forming a pattern to a member to be applied, which is selected from the group consisting of a base material (subjected to an adhesion treatment such as forming an interlayer as necessary) and a mold, and then a member which is not selected as the member to be applied from the group consisting of the base material and the mold is brought into contact with the curable layer as a contact member. For example, the curable layer is cured by light irradiation or the like in a state in which the above-described contact member and the above-described curable layer are in contact with each other, and then the mold is released to produce a cured substance to which a desired pattern is transferred.

In such an imprinting method, since it is necessary to release the mold from the composition for forming a pattern while leaving the composition for forming a pattern on the base material, sufficient adhesiveness between the base material and the composition for forming a pattern may be required.

Therefore, the composition as described in JP2018-080260A is used to form an interlayer between the base material and the curable layer.

As described above, in a case where the interlayer is formed between the base material and the curable layer, there is room for further improvement in the point that pattern defects of a pattern obtained from the curable layer formed on the interlayer are generated.

An object of the present invention is to provide a curable composition which is used for forming an interlayer existing between a base material and a curable layer, in which a solution stability of the curable composition and a suppression of pattern defects of the curable layer formed on the interlayer formed by the composition are excellent; a kit including the curable composition; an interlayer formed from the curable composition; a laminate including the interlayer; an imprint pattern producing method using the laminate; and a method for manufacturing a device including the imprint pattern producing method.

Typical embodiments of the present invention are shown below.

<1> A curable composition used for forming an interlayer existing between a base material and a curable layer, the curable composition comprising:
  a curable main agent having a polymerizable functional group;
  a polymerization inhibitor; and
  a solvent,
  in which a content of the polymerization inhibitor is 1 part by mass or greater and lower than 1,000 parts by mass with respect to 1,000,000 parts by mass of the curable main agent.
<2> The curable composition according to <1>,
  in which the polymerization inhibitor includes at least one compound selected from a phenol-based compound, a quinone-based compound, a free radical-based compound, an amine-based compound, or a phosphine-based compound.

<3> The curable composition according to <1> or <2>, in which a molecular weight of the polymerization inhibitor is 1,000 or less.

<4> The curable composition according to any one of <1> to <3>, in which the content of the polymerization inhibitor is 900 parts by mass or lower with respect to 1,000,000 parts by mass of the curable main agent.

<5> The curable composition according to any one of <1> to <4>, in which the content of the polymerization inhibitor is 200 parts by mass or greater with respect to 1,000,000 parts by mass of the curable main agent.

<6> The curable composition according to any one of <1> to <5>, in which the interlayer is a closely adhesive film for an imprint lithography.

<7> The curable composition according to any one of <1> to <6>, in which a content of the polymerization inhibitor in the interlayer is 1 part by mass or greater and 900 parts by mass or lower with respect to 1,000,000 parts by mass of components in the interlayer, excluding the polymerization inhibitor.

<8> A kit comprising:
the curable composition according to any one of <1> to <7>; and
a composition for forming a pattern, which includes a polymerizable compound.

<9> An interlayer formed from the curable composition according to any one of <1> to <7>.

<10> A laminate comprising:
a base material; and
an interlayer formed from the curable composition according to any one of <1> to <7>.

<11> An imprint pattern producing method comprising:
a curable layer-forming step of applying a composition for forming a pattern to a member to be applied, which is selected from the group consisting of the laminate according to <10> and a mold;
a contact step of contacting a member which is not selected as the member to be applied from the group consisting of the laminate and the mold with the composition for forming a pattern as a contact member;
a curing step of forming a cured substance with the composition for forming a pattern; and
a peeling step of peeling off the cured substance from the mold.

<12> A method for manufacturing a device, comprising: the imprint pattern producing method according to <11>.

According to the present invention, a curable composition which is used for forming an interlayer existing between a base material and a curable layer, in which a solution stability of the curable composition and a suppression of pattern defects of the curable layer formed on the interlayer formed by the composition are excellent; a kit including the curable composition; an interlayer formed from the curable composition; a laminate including the interlayer; an imprint pattern producing method using the laminate; and a method for manufacturing a device including the imprint pattern producing method are provided.

DESCRIPTION OF THE PREFERRED EMBODIMENTS

Hereinafter, representative embodiments of the present invention will be described. Respective constituent elements will be described based on the representative embodiments for convenience, but the present invention is not limited to such embodiments.

In the present specification, a numerical range expressed using the term "to" means a range which includes the preceding and succeeding numerical values of "to" as a lower limit value and an upper limit value, respectively.

In the present specification, the term "step" is meant to include not only an independent step, but also a step which cannot be clearly distinguished from other steps as long as an intended action of the step is achieved.

In the present specification, with regard to a group (atomic group), in a case where the group (atomic group) is described without specifying whether the group (atomic group) is substituted or unsubstituted, the description means that the group (atomic group) includes both a group (atomic group) having no substituent and a group having a substituent. For example, in a case where a group is simply described as an "alkyl group", the description means that the alkyl group includes both an alkyl group having no substituent (unsubstituted alkyl group) and an alkyl group having a substituent (substituted alkyl group).

In the present specification, unless otherwise specified, "exposure" is meant to include not only drawing using light but also drawing using particle rays such as electron beams and ion beams. Examples of energy rays used for the drawing include actinic rays such as a bright line spectrum of a mercury lamp, far ultraviolet rays typified by an excimer laser, extreme ultraviolet rays (EUV light), and X-rays, and particle rays such as electron beams and ion beams.

In the present specification, "(meth)acrylate" means both "acrylate" and "methacrylate" or either of them, "(meth)acryl" means both "acryl" and "methacryl" or either of them, and "(meth)acryloyl" means both "acryloyl" and "methacryloyl" or either of them.

In the present specification, a solid content in a composition means components other than a solvent, and a content (concentration) of the solid content in the composition is represented by the mass percentage of the components other than the solvent with respect to the total mass of the composition, unless otherwise specified.

In the present specification, a temperature is 23° C., an atmospheric pressure is 101,325 Pa (1 atm), and a relative humidity is 50% RH, unless otherwise specified.

In the present specification, a weight-average molecular weight (Mw) and a number-average molecular weight (Mn) are each expressed as a value in terms of polystyrene according to gel permeation chromatography (GPC measurement), unless otherwise specified. The weight-average molecular weight (Mw) and the number-average molecular weight (Mn) can be determined, for example, by using HLC-8220 (manufactured by TOSOH CORPORATION), and, as columns, GUARD COLUMN HZ-L, TSKgel Super HZM-M, TSKgel Super HZ4000, TSKgel Super HZ3000, and TSKgel Super HZ2000 (manufactured by TOSOH CORPORATION). Moreover, the measurement is performed using tetrahydrofuran (THF) as an eluent, unless otherwise specified. Furthermore, for the detection in the GPC measurement, a detector of ultraviolet rays (UV rays) having a wavelength of 254 nm is used, unless otherwise specified.

In the present specification, regarding a positional relationship of respective layers constituting a laminate, in a case where there is a description of "upper" or "lower", another layer may be on an upper side or a lower side of a reference layer among a plurality of layers of interest. That is, a third layer or element may be further interposed between the reference layer and the other layer, and the reference layer and the other layer are not necessary to be in contact with each other. Moreover, unless otherwise specified, in a case where a direction in which layers are stacked on a base material is referred to as "upward" or there is a photosensitive layer, a direction from the base material to the photosensitive layer is referred to as "upward", and the opposite direction is referred to as "downward". Furthermore, such setting of upward and downward directions is for convenience in the present specification, and in a practical aspect, the "upward" direction in the present specification may be different from a vertically upward direction.

In the present specification, "imprint" preferably refers to transfer of a pattern with a size of 1 nm to 10 mm, and more preferably refers to transfer (nanoimprint) of a pattern with a size of about 10 nm to 100 µm.

(Curable Composition)

A curable composition according to an embodiment of the present invention, which is used for forming an interlayer existing between a base material and a curable layer, the curable composition including a curable main agent having a polymerizable functional group, a polymerization inhibitor, and a solvent, in which a content of the polymerization inhibitor is 1 part by mass or greater and lower than 1,000 parts by mass with respect to 1,000,000 parts by mass of the curable main agent.

The curable composition according to the embodiment of the present invention is excellent in solution stability of the curable composition and suppression of pattern defects of the curable layer formed on the interlayer formed by the above-described composition.

The mechanism for obtaining the above-described effects is not clear, but is presumed as follows.

The curable composition according to the embodiment of the present invention includes 1 part by mass or greater of the polymerization inhibitor with respect to 1,000,000 parts by mass of the above-described curable main agent. Therefore, it is considered that a polymerizable functional group of the curable main agent is suppressed from being polymerized in the solvent included in the curable composition, and the solution stability is excellent.

In addition, in the curable composition according to the embodiment of the present invention, the content of the polymerization inhibitor is lower than 1,000 parts by mass with respect to 1,000,000 parts by mass of the above-described curable main agent. Therefore, it is considered that an influence of the polymerization inhibitor in the curable composition on a curing reaction in the curable layer is reduced, and a generation of pattern defects is suppressed.

In particular, in a case where the curable composition according to the embodiment of the present invention is applied to a base material and at least a part of the solvent is removed (dried) by heating to form an interlayer, since at least a part of the polymerization inhibitor in the curable composition is volatilized by the heating, it is presumed that the influence of the polymerization inhibitor in the curable composition on the curing reaction in the curable layer tends to be smaller, and the generation of pattern defects is more likely to be suppressed.

Hereinafter, details of each component included in the curable composition according to the embodiment of the present invention will be described.

<Formation of Interlayer>

The curable composition according to the embodiment of the present invention is used for forming an interlayer existing between a base material and a curable layer.

It is preferable that the above-described interlayer and the base material are in direct contact with each other.

In addition, it is preferable that the above-described interlayer and the curable layer are in direct contact with each other.

The above-described interlayer is preferably a closely adhesive film for an imprint lithography. The closely adhesive film for an imprint lithography refers to a closely adhesive film formed between the curable layer and the base material, which is used for an imprint lithography.

A method for forming the interlayer and the curable layer is not particularly limited, and examples thereof include a method in which a curable composition is applied in a layered manner to a base material, at least a part of a solvent in the curable composition is removed to form an interlayer, and then a curable layer is formed on the interlayer.

Examples of the method for forming the interlayer and the method for forming the curable layer each include an interlayer-forming step and a curable layer-forming step or contact step in an imprint pattern forming method described later.

Among them, the curable composition according to the embodiment of the present invention is preferably used for forming an interlayer, which includes a step of removing the solvent in the curable composition by heating.

A content of the above-described polymerization inhibitor in the interlayer is preferably 1 to 900 parts by mass, more preferably 200 to 850 parts by mass, and still more preferably 300 to 800 parts by mass with respect to 1,000,000 parts by mass of components in the above-described interlayer, excluding the above-described polymerization inhibitor.

The content of the above-described polymerization inhibitor in the above-described interlayer may be a value lower than the content of the polymerization inhibitor with respect to the solid content of the curable composition due to a process (for example, heating) in forming the interlayer, and is preferably a value lower than the content of the polymerization inhibitor with respect to the solid content of the curable composition.

The content of the polymerization inhibitor in the above-described interlayer is measured, for example, by a method in Examples described later.

<Curable Main Agent>

The curable composition according to the embodiment of the present invention contains a curable main agent having a polymerizable functional group.

The curable main agent is preferably a polymer compound having a polymerizable functional group.

The type of the polymer compound is not particularly limited, and a known polymer compound can be widely used.

Examples of the polymer compound include a (meth)acrylic resin, a vinyl resin, a novolac resin, an epoxy resin, a polyurethane resin, a phenol resin, a polyester resin, and a melamine resin, and at least one of a (meth)acrylic resin, a vinyl resin, or a novolac resin is preferable.

In the present invention, a weight-average molecular weight of the polymer compound is preferably 4,000 or more, more preferably 6,000 or more, and still more preferably 10,000 or more. The upper limit thereof is preferably 70,000 or less and may be 50,000 or less. A method for measuring the molecular weight is as described above. In a case where the weight-average molecular weight is 4,000 or more, film stability during a heating treatment is improved, which leads to the improvement in a surface condition during the formation of the interlayer. In addition, in a case where the weight-average molecular weight is 70,000 or less, the solubility in a solvent is improved, and thus the spin coat application and the like are easily performed.

The polymerizable functional group included in the above-described polymer compound is more preferably at least one selected from the group consisting of a group having an ethylenically unsaturated bond, an amino group, an isocyanate group, an epoxy group (oxirane group), and a hydroxy group.

Examples of the group having an ethylenically unsaturated bond include a (meth)acryloyl group (preferably a (meth)acryloyloxy group and a (meth)acrylamide group), a vinyl group, a vinyloxy group, an allyl group, a methylallyl group, a propenyl group, a butenyl group, a vinylphenyl group, and a cyclohexenyl group, and a (meth)acryloyloxy group or a vinyl group is preferable.

The above-described isocyanate group may be a blocked isocyanate group by a known blocking agent.

As the above-described polymerizable functional group, the curable main agent preferably includes at least one of a radically polymerizable group or a cationically polymerizable group, and more preferably includes a radically polymerizable group.

The curable main agent may include a plurality types of polymerizable functional groups, such as those including a radically polymerizable group and a cationically polymerizable group.

The curable main agent preferably has a plurality of polymerizable functional groups.

In a case where the curable main agent has a plurality of polymerizable groups, the interlayer forms a crosslinking structure, aggregation breakage of the interlayer in a case of releasing is prevented, and it is possible to ensure adhesiveness between the base material and the curable layer provided on both sides of the interlayer.

The curable main agent preferably has a polar group in order to strengthen the adhesiveness to the base material. Specific examples of the polar group include a hydroxy group, a carboxy group, an amide group, an imide group, a urea group, a urethane group, a cyano group, an ether group (preferably, a polyalkyleneoxy group), a cyclic ether group, a lactone group, a sulfonyl group, a sulfo group, a sulfonic acid group, a sulfonamide group, a sulfonimide group, a phosphoric acid group, a phosphate group, a nitrile group, and a thiol group. Among them, in particular, the polar group is preferably a sulfonyl group, a sulfo group, a sulfonic acid group, a sulfonamide group, a sulfonimide group, a phosphoric acid group, a phosphate group, a nitrile group, a carboxy group, an amino group, or a hydroxy group, and more preferably a carboxy group or a hydroxy group.

The curable main agent preferably includes a polymer having at least one constitutional unit among constitutional units represented by Formulae (1) to (3).

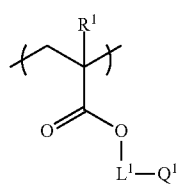

(1)

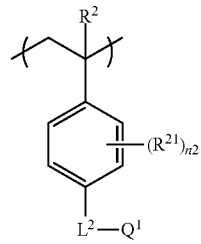

(2)

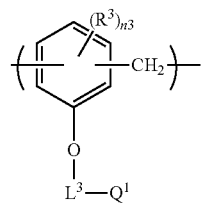

(3)

In the formulae, $R^1$ and $R^2$ are each independently a hydrogen atom or a methyl group. $R^{21}$ and $R^3$ are each independently a substituent T which will be described later. n2 is an integer of 0 to 4. n3 is an integer of 0 to 3.

$L^1$, $L^2$, and $L^3$ are each independently a single bond or a linking group L which will be described later. Among them, a single bond, or an alkylene group or an (oligo)alkyleneoxy group, which is defined as the linking group L, is preferable. Here, the presence or absence of an oxygen atom at a terminal of the (oligo)alkyleneoxy group may be adjusted according to a structure of a preceding group. In the present specification, the "(oligo)alkyleneoxy group" means a divalent linking group having one or more "alkyleneoxy" constitutional units. The number of carbon atoms in an alkylene chain in the constitutional unit may be the same or different for every constitutional unit.

$Q^1$ is a functional group, and examples thereof include the polymerizable functional group included in the above-described curable main agent.

In a case where there is a plurality of $R^{21}$'s, $R^{21}$'s may be linked to each other to form a cyclic structure. In the present specification, the linking is meant to include not only an aspect in which groups are continued by bonding but also an aspect in which groups lose some atoms and are fused (condensed). Moreover, unless otherwise specified, an oxygen atom, a sulfur atom, or a nitrogen atom (amino group) may be interposed in a case of the linking. Examples of the formed cyclic structure include an aliphatic hydrocarbon ring (the ring is referred to as a ring CO (for example, a cyclopropane ring, a cyclobutane ring, a cyclopentane ring, a cyclohexane ring, a cyclopropene ring, a cyclobutene ring, a cyclopentene ring, a cyclohexene ring, and the like), an aromatic hydrocarbon ring (the ring is referred to as a ring Cr) (a benzene ring, a naphthalene ring, an anthracene ring, a phenanthrene ring, and the like), a nitrogen-containing heterocyclic ring (the ring is referred to as a ring Cn) (for example, a pyrrole ring, an imidazole ring, a pyrazole ring, a pyridine ring, a pyrroline ring, a pyrrolidine ring, an imidazolidine ring, a pyrazolidine ring, a piperidine ring, a piperazine ring, a morpholine ring, and the like), an oxygen-containing heterocyclic ring (the ring is referred to as a ring Co) (a furan ring, a pyran ring, an oxirane ring, an oxetane ring, a tetrahydrofuran ring, a tetrahydropyran ring, a dioxane ring, and the like), and a sulfur-containing heterocyclic ring (the ring is referred to as a ring Cs) (a thiophene ring, a thiirane ring, a thietane ring, a tetrahydrothiophene ring, a tetrahydrothiopyran ring, and the like).

In a case where there is a plurality of $R^3$'s, $R^3$'s may be linked to each other to form a cyclic structure. Examples of the formed cyclic structure include the ring Cf, the ring Cr, the ring Cn, the ring Co, and the ring Cs.

The curable main agent may be a copolymer having a constitutional unit other than the constitutional units represented by Formulae (1) to (3). Examples of other constitutional units include a constitutional unit represented by (11), (21), or (31). It is preferable that the curable main agent has the constitutional unit (11) and the constitutional unit (1), has the constitutional unit (21) and the constitutional unit (2), or has the constitutional unit (31) and the constitutional unit (3).

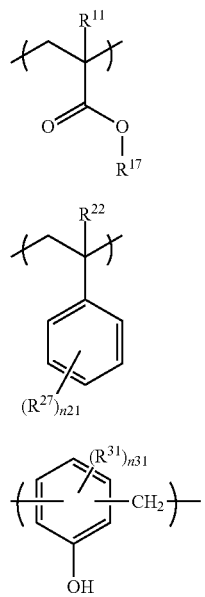

In the formulae, $R^{11}$ and $R^{22}$ are each independently a hydrogen atom or a methyl group. $R^{31}$ is the substituent T which will be described later, and n31 is an integer of 0 to 3. In a case where there is a plurality of $R^{31}$'s, $R^{31}$'s may be linked to each other to form a cyclic structure. Examples of the formed cyclic structure include examples of the ring Cf, the ring Cr, the ring Cn, the ring Co, and the ring Cs.

$R^{17}$ is an organic group, which forms an ester structure with a carbonyloxy group in the formula, or a hydrogen atom. Examples of the organic group include an alkyl group (the number of carbon atoms is preferably 1 to 24, more preferably 1 to 12, and still more preferably 1 to 6; and the alkyl group may be chain-like or cyclic, or may be linear or branched), an aryl group (the number of carbon atoms is preferably 6 to 22, more preferably 6 to 18, and still more preferably 6 to 10), an arylalkyl group (the number of carbon atoms is preferably 7 to 23, more preferably 7 to 19, and still more preferably 7 to 11; and the alkyl group moiety may be chain-like or cyclic, or may be linear or branched), a group consisting of an aromatic heterocyclic ring in which an oxygen atom in the formula is bonded to a carbon atom (in terms of cyclic structure, a pyrrole ring, an imidazole ring, a pyrazole ring, a pyridine ring, a furan ring, a thiophene ring, a thiazole ring, an oxazole ring, an indole ring, a carbazole ring, and the like), and a group consisting of an aliphatic heterocyclic ring in which an oxygen atom in the formula is bonded to a carbon atom (in terms of cyclic structure, a pyrroline ring, a pyrrolidine ring, an imidazolidine ring, a pyrazolidine ring, a piperidine ring, a piperazine ring, a morpholine ring, a pyran ring, an oxirane ring, an oxetane ring, a tetrahydrofuran ring, a tetrahydropyran ring, a dioxane ring, a thiirane ring, a thietane ring, a tetrahydrothiophene ring, and a tetrahydrothiopyran ring).

$R^{17}$ may further have the substituent T as long as the effects of the present invention are exhibited.

$R^{27}$ is the substituent T which will be described later, and n21 is an integer of 0 to 5. In a case where there is a plurality of $R^{27}$'s, $R^{27}$'s may be linked to each other to form a cyclic structure. Examples of the formed cyclic structure include examples of the ring Cf, the ring Cr, the ring Cn, the ring Co, and the ring Cs.

Examples of the substituent T include an alkyl group (the number of carbon atoms is preferably 1 to 24, more preferably 1 to 12, and still more preferably 1 to 6), an arylalkyl group (the number of carbon atoms is preferably 7 to 21, more preferably 7 to 15, and still more preferably 7 to 11), an alkenyl group (the number of carbon atoms is preferably 2 to 24, more preferably 2 to 12, and still more preferably 2 to 6), a hydroxy group, an amino group ($-NR^N_2$) (the number of carbon atoms is preferably 0 to 24, more preferably 0 to 12, and still more preferably 0 to 6), a sulfanyl group, a carboxy group, an aryl group (the number of carbon atoms is preferably 6 to 22, more preferably 6 to 18, and still more preferably 6 to 10), an alkoxy group (the number of carbon atoms is preferably 1 to 12, more preferably 1 to 6, and still more preferably 1 to 3), an aryloxy group (the number of carbon atoms is preferably 6 to 22, more preferably 6 to 18, and still more preferably 6 to 10), an acyl group (the number of carbon atoms is preferably 2 to 12, more preferably 2 to 6, and still more preferably 2 or 3), an acyloxy group (the number of carbon atoms is preferably 2 to 12, more preferably 2 to 6, and still more preferably 2 or 3), an aryloyl group (the number of carbon atoms is preferably 7 to 23, more preferably 7 to 19, and still more preferably 7 to 11), an aryloyloxy group (the number of carbon atoms is preferably 7 to 23, more preferably 7 to 19, and still more preferably 7 to 11), a carbamoyl group (the number of carbon atoms is preferably 1 to 12, more preferably 1 to 6, and still more preferably 1 to 3), a sulfamoyl group (the number of carbon atoms is preferably 0 to 12, more preferably 0 to 6, and still more preferably 0 to 3), a sulfo group, a sulfoxy group, a phosphono group, a phosphonooxy group, an alkylsulfonyl group (the number of carbon atoms is preferably 1 to 12, more preferably 1 to 6, and still more preferably 1 to 3), an arylsulfonyl group (the number of carbon atoms is preferably 6 to 22, more preferably 6 to 18, and still more preferably 6 to 10), a heterocyclic group (at least one of an oxygen atom, a nitrogen atom, or a sulfur atom is contained; the number of carbon atoms is preferably 1 to 12, more preferably 1 to 8, and still more preferably 2 to 5; and a 5-membered ring or a 6-membered ring is preferably contained), a (meth)acryloyl group, a (meth)acryloyloxy group, a halogen atom (for example, a fluorine atom, a chlorine atom, a bromine atom, and an iodine atom), an oxo group (=O), an imino group (=$NR^N$), and an alkylidene group (=$C(R^N)_2$).

$R^N$ is a hydrogen atom, an alkyl group of the substituent T, an alkenyl group of the substituent T, an aryl group of the substituent T, an arylalkyl group of the substituent T, or a heterocyclic group of the substituent T.

An alkyl moiety and an alkenyl moiety contained in each substituent may be chain-like or cyclic, or may be linear or branched. In a case where the substituent T is a group which can have a substituent, the substituent T may further have a substituent T. For example, a hydroxyalkyl group in which a hydroxy group is substituted for an alkyl group may be mentioned.

Examples of the linking group L include an alkylene group (the number of carbon atoms is preferably 1 to 24, more preferably 1 to 12, and still more preferably 1 to 6), an alkenylene group (the number of carbon atoms is preferably 2 to 12, more preferably 2 to 6, and still more preferably 2 or 3), an (oligo)alkyleneoxy group (the number of carbon atoms in an alkylene group in one constitutional unit is preferably 1 to 12, more preferably 1 to 6, and still more preferably 1 to 3; and the repetition number is preferably 1 to 50, more preferably 1 to 40, and still more preferably 1 to 30), an arylene group (the number of carbon atoms is preferably 6 to 22, more preferably 6 to 18, and still more preferably 6 to 10), an oxygen atom, a sulfur atom, a sulfonyl group, a carbonyl group, a thiocarbonyl group, —NR$^N$—, and a linking group related to a combination thereof. The alkylene group, alkenylene group, and alkyleneoxy group may have the substituent T. For example, the alkylene group may have a hydroxy group.

A linking chain length of the linking group L is preferably 1 to 24, more preferably 1 to 12, and still more preferably 1 to 6. The linking chain length means the number of atoms positioned on the shortest path among the atomic groups involved in the linkage. For example, in a case of —CH$_2$C (=O)—O—, the linking chain length is 3.

Furthermore, the alkylene group, alkenylene group, and (oligo)alkyleneoxy group as the linking group L may be chain-like or cyclic, or may be linear or branched.

It is preferable that as an atom constituting the linking group L, a carbon atom, a hydrogen atom, and as necessary, a heteroatom (at least one kind selected from an oxygen atom, a nitrogen atom, or a sulfur atom, and the like) are included. The number of carbon atoms in the linking group is preferably 1 to 24, more preferably 1 to 12, and still more preferably 1 to 6. The number of hydrogen atoms may be determined according to the number of carbon atoms and the like. In a case of the number of heteroatoms, the numbers of the oxygen atoms, the nitrogen atoms, and the sulfur atoms are each preferably 0 to 12, more preferably 0 to 6, and still more preferably 0 to 3.

The polymer compound may be synthesized by a conventional method. For example, for the synthesis of the polymer having the constitutional unit represented by Formula (1), a known method for addition polymerization of olefin can be appropriately adopted. For the polymer having the constitutional unit represented by Formula (2), a known method for addition polymerization of styrene can be appropriately adopted. For the synthesis of the polymer having the constitutional unit represented by Formula (3), a known method for synthesis of a phenol resin can be appropriately adopted.

A formulating amount of the curable main agent is not particularly limited, but in the curable composition, it is preferable to occupy the majority in the solid content, more preferable to be 70% by mass or greater in the solid content, and still more preferable to be 80% by mass or greater in the solid content. The upper limit thereof is not particularly limited, but is preferably 99.0% by mass or lower.

A content of the curable main agent with respect to the total mass of the curable composition is not particularly limited, but is preferably 0.01% by mass or greater, more preferably 0.05% by mass or greater, and still more preferably 0.1% by mass or greater. The upper limit thereof is preferably 10% by mass or lower, more preferably 5% by mass or lower, still more preferably 1% by mass or lower, and even more preferably lower than 1% by mass.

The curable composition may include only one kind of curable main agent or two or more kinds thereof In a case where two or more kinds thereof are included, the total amount thereof is preferably within the above-described range.

<Polymerization Inhibitor>

The curable composition according to the embodiment of the present invention includes a polymerization inhibitor.

The polymerization inhibitor is not particularly limited, and a known polymerization inhibitor may be selected depending on the type of the polymerizable functional group in the curable main agent, but a radical polymerization inhibitor is preferable.

The polymerization inhibitor preferably includes at least one compound selected from a phenol-based compound, a quinone-based compound, a free radical-based compound, an amine-based compound, or a phosphine-based compound, and from the viewpoint of polymerization inhibitory ability, a free radical-based compound is more preferable.

Examples of the phenol-based compound include 4-methoxyphenol, hydroquinone, 2-tert-butylhydroquinone, 4-tert-butylcatechol, pentaerythritol tetrakis [3-(3,5-di-tert-butyl-4-hydroxyphenyl)propionate], 2,5-di-tert-butyl-4-methylphenol, 2,6-di-tert-butyl-4-methylphenol, 4,4'-thiobis (3-methyl-6-t-butylphenol), 2,2'-methylenebis(4-methyl-6-t-butylphenol), 4-methoxynaphthol, 2,4-bis (octylthiomethyl)-6-methylphenol, p-nitrosophenol, and α-nitroso-β-naphthol.

Examples of the quinone-based compound include 1,4-benzoquinone, 1,2-benzoquinone, and 1,4-naphthoquinone.

Examples of the free radical-based compound include poly(4-methacryloyloxy-2,2,6,6-tetramethylpiperidin-N-oxyl), 4-hydroxy-2,2,6,6-tetramethylpiperidine 1-oxyl, 2,2, 6,6-tetramethylpiperidine 1-oxyl, 2,2-diphenyl-1-picrylhydrazyl, and triphenyl phthalazinyl.

Examples of the amine-based compound include p-phenylenediamine, 4-aminodiphenylamine, N,N-diethylhydroxylamine, N,N'-diphenyl-p-phenylenediamine, N-isopropyl-N'-phenyl-p-phenylenediamine, N-(1,3-dimethylbutyl)-N'-phenyl-p-phenylenediamine, N,N'-di-2-naphthyl-p-phenylenediamine, diphenylamine, N-phenyl-β-naphthylamine, 4,4'-dicumyl-diphenylamine, 4,4'-dioctyl-diphenylamine, phenothiazine, 2-methoxyphenothiazine, phenoxazine, N-nitrosodiphenylamine, N-nitrosophenylnaphthylamine, N-nitrosodinaphthylamine, p-nitrosodiphenylamine, N-nitroso-N-phenylhydroxylamine, cupferron, and a compound of a salt thereof.

Examples of the phosphine-based compound include phosphorous acid (2,4-di-tert-butylphenyl).

In addition, as the polymerization inhibitor, nitrobenzene compounds such as nitrobenzene and 4-nitrotoluene or thiol ethers such as dioctadecyl 3,3'-thiodipropionate, dilauryl thiodipropionate, dimyristyl thiodipropionate, and distearyl thiodipropionate may be included.

From the viewpoint of suppressing the pattern defects, a molecular weight of the polymerization inhibitor included in the curable composition according to the embodiment of the present invention is preferably 1,000 or less, more preferably 800 or less, and still more preferably 500 or less. The lower limit of the above-described molecular weight is not particularly limited, but is preferably 80 or more.

A content of the polymerization inhibitor is preferably 900 parts by mass or lower, more preferably 850 parts by mass or lower, and still more preferably 800 parts by mass or lower with respect to 1,000,000 parts by mass of the curable main agent.

Moreover, the content of the polymerization inhibitor is preferably 200 parts by mass or greater, more preferably 250 parts by mass or greater, and still more preferably 300 parts by mass or greater with respect to 1,000,000 parts by mass of the curable main agent.

The curable composition according to the embodiment of the present invention may contain one kind of polymerization inhibitor alone or two or more kinds thereof. In a case of containing two or more kinds of polymerization inhibitors, it is preferable that the total amount thereof is within the above-described range.

<Solvent>

The curable composition contains a solvent (hereinafter, may be referred to as a "solvent for the curable composition"). The solvent is, for example, preferably a compound which is liquid at 23° C. and has a boiling point of 250° C. or lower. For example, by removing at least a part of the solvent from the curable composition, the interlayer is formed. The curable composition contains the solvent for the curable composition in an amount of preferably 99.0% by mass or greater and more preferably 99.5% by mass or greater, and the amount may be 99.6% by mass or greater. By setting the proportion of the solvent for the curable composition within the above-described range, a film thickness during film formation is kept thin, and thus pattern formability during etching processing is improved.

Only one kind or two or more kinds of the solvents for the curable composition may be contained in the curable composition. In a case where two or more kinds thereof are contained, the total amount thereof is preferably within the above-described range.

A boiling point of the solvent for the curable composition is preferably 230° C. or lower, more preferably 200° C. or lower, still more preferably 180° C. or lower, even more preferably 160° C. or lower, and further still more preferably 130° C. or lower. The lower limit value thereof is preferably 23° C. or higher and more preferably 60° C. or higher. By setting the boiling point within the above-described range, the solvent can be easily removed in a case of forming the interlayer, for example, by heating, which is preferable.

The solvent for the curable composition is preferably an organic solvent. The solvent is preferably a solvent having any one or more of an alkylcarbonyl group, a carbonyl group, a hydroxy group, or an ether group. Among them, it is preferable to use an aprotic polar solvent.

As specific examples of the solvent for the curable composition, alkoxy alcohol, propylene glycol monoalkyl ether carboxylate, propylene glycol monoalkyl ether, lactic acid ester, acetic acid ester, alkoxypropionic acid ester, chain-like ketone, cyclic ketone, lactone, or alkylene carbonate is selected.

Examples of the alkoxy alcohol include methoxyethanol, ethoxyethanol, methoxypropanol (for example, 1-methoxy-2-propanol), ethoxypropanol (for example, 1-ethoxy-2-propanol), propoxypropanol (for example, 1-propoxy-2-propanol), methoxybutanol (for example, 1-methoxy-2-butanol and 1-methoxy-3-butanol), ethoxybutanol (for example, 1-ethoxy-2-butanol and 1-ethoxy-3-butanol), and methylpentanol (for example, 4-methyl-2-pentanol).

As the propylene glycol monoalkyl ether carboxylate, at least one selected from the group consisting of propylene glycol monomethyl ether acetate, propylene glycol monomethyl ether propionate, and propylene glycol monoethyl ether acetate is preferable, and propylene glycol monomethyl ether acetate (PGMEA) is particularly preferable.

In addition, as the propylene glycol monoalkyl ether, propylene glycol monomethyl ether (PGME) or propylene glycol monoethyl ether is preferable.

As the lactic acid ester, ethyl lactate, butyl lactate, or propyl lactate is preferable.

As the acetic acid ester, methyl acetate, ethyl acetate, butyl acetate, isobutyl acetate, propyl acetate, isoamyl acetate, methyl formate, ethyl formate, butyl formate, propyl formate, or 3-methoxybutyl acetate is preferable.

As the alkoxypropionic acid ester, methyl 3-methoxypropionate (MMP) or ethyl 3-ethoxypropionate (EEP) is preferable.

As the chain-like ketone, 1-octanone, 2-octanone, 1-nonanone, 2-nonanone, acetone, 4-heptanone, 1-hexanone, 2-hexanone, diisobutyl ketone, phenylacetone, methyl ethyl ketone, methyl isobutyl ketone, acetylacetone, acetonylacetone, ionone, diacetonyl alcohol, acetylcarbinol, acetophenone, methyl naphthyl ketone, or methyl amyl ketone is preferable.

As the cyclic ketone, methylcyclohexanone, isophorone, or cyclohexanone is preferable.

As the lactone, γ-butyrolactone (γBL) is preferable.

As the alkylene carbonate, propylene carbonate is preferable.

In addition to the above-described components, an ester-based solvent having 7 or more (preferably 7 to 14, more preferably 7 to 12, and still more preferably 7 to 10) carbon atoms and having 2 or less heteroatoms is preferably used.

Preferred examples of the ester-based solvent having 7 or more carbon atoms and 2 or less heteroatoms include amyl acetate, 2-methylbutyl acetate, 1-methylbutyl acetate, hexyl acetate, pentyl propionate, hexyl propionate, butyl propionate, isobutyl isobutyrate, heptyl propionate, and butyl butanoate, and isoamyl acetate is particularly preferably used.

In addition, a solvent having a flash point (hereinafter, also referred to as a p component) of 30° C. or higher is also preferably used. As such a component, propylene glycol monomethyl ether (p component: 47° C.), ethyl lactate (p component: 53° C.), ethyl 3-ethoxypropionate (p component: 49° C.), methyl amyl ketone (p component: 42° C.), cyclohexanone (p component: 30° C.), pentyl acetate (p component: 45° C.), methyl 2-hydroxyisobutyrate (p component: 45° C.), γ-butyrolactone (p component: 101° C.), or propylene carbonate (p component: 132° C.) is preferable. Among them, propylene glycol monoethyl ether, ethyl lactate, pentyl acetate, or cyclohexanone is more preferable, and propylene glycol monoethyl ether or ethyl lactate is particularly preferable.

Examples of a preferred solvent among the solvents for the curable composition include alkoxy alcohol, propylene glycol monoalkyl ether carboxylate, propylene glycol monoalkyl ether, lactic acid ester, acetate, alkoxypropionic acid ester, chain-like ketone, cyclic ketone, lactone, and alkylene carbonate.

<Other Components>

The curable composition may contain one or more kinds of an alkylene glycol compound, a polymerization initiator, an antioxidant, a leveling agent, a thickener, a surfactant, or the like, in addition to the above-described components.

[Alkylene Glycol Compound]

The curable composition may contain an alkylene glycol compound. In the alkylene glycol compound, the number of alkylene glycol constitutional units is preferably 3 to 1,000, more preferably 4 to 500, still more preferably 5 to 100, and even more preferably 5 to 50. A weight-average molecular weight (Mw) of the alkylene glycol compound is preferably 150 to 10,000, more preferably 200 to 5,000, still more preferably 300 to 3,000, and even more preferably 300 to 1,000.

Examples of the alkylene glycol compound include polyethylene glycol, polypropylene glycol, mono- or dimethyl ether thereof, mono- or dioctyl ether, mono- or dinonyl ether, mono- or didecyl ether, monostearic acid ester, monooleic acid ester, monoadipic acid ester, and monosuccinic acid ester, and polyethylene glycol or polypropylene glycol is preferable.

A surface tension of the alkylene glycol compound at 23° C. is preferably 38.0 mN/m or greater and more preferably 40.0 mN/m or greater. The upper limit of the surface tension is not particularly specified, but is, for example, 48.0 mN/m or lower. By formulating such a compound, wettability of the composition for forming a pattern applied immediately above the interlayer can be further improved.

The surface tension is measured at 23° C. using a surface tensiometer SURFACE TENS-IOMETER CBVP-A3 manufactured by Kyowa Interface Science Co., LTD. and a glass plate. The unit is mN/m. Two samples are produced for one level and are respectively measured three times. An arithmetic mean value of a total of six times is adopted as an evaluation value.

In a case where the curable composition contains an alkylene glycol compound, a content thereof is preferably 40% by mass or lower of the solid content of the curable composition, more preferably 30% by mass or lower, still more preferably 20% by mass or lower, and particularly preferably 1% to 15% by mass. The alkylene glycol compound may be used alone or in combination of two or more kinds thereof In a case where two or more kinds thereof are used, the total amount thereof is preferably within the above-described range.

[Polymerization Initiator]

The curable composition may include a polymerization initiator and preferably contains at least one kind of a thermal polymerization initiator or a photopolymerization initiator.

By containing the polymerization initiator, a reaction of the polymerizable functional group included in the curable composition is promoted, and thus the adhesiveness tends to be improved.

From the viewpoint that crosslinking reactivity with the curable layer is improved, the polymerization initiator is preferably a photopolymerization initiator.

Moreover, examples of the polymerization initiator include a radical polymerization initiator and a cationic polymerization initiator, and for example, the polymerization initiator may be selected according to the type of the polymerizable functional group included in the curable main agent.

Examples of a preferred aspect of the present invention include an aspect in which the curable main agent includes a radically polymerizable group as the polymerizable functional group and the curable composition contains a radical polymerization initiator as the polymerization initiator.

In addition, from the viewpoint of improving the adhesiveness between the interlayer and the curable layer, it is preferable that the curable composition does not substantially contain the polymerization initiator. In a case where the interlayer does not substantially contain the polymerization initiator, a polymerization reaction between the curable main agent included in the curable composition and the polymerizable compound included in the curable layer is likely to occur, and it is considered that the adhesiveness is excellent.

The fact that the curable composition does not substantially contain the polymerization initiator means that the content of the polymerization initiator is lower than 0.0001% by mass with respect to the total solid content of the curable composition, and lower than 0.00001% by mass is preferable. The lower limit of the above-described content thereof is not particularly limited and may be 0% by mass.

As the thermal polymerization initiator, the respective components described in JP2013-036027A, JP2014-090133A, and JP2013-189537A can be used. Also regarding the content or the like, reference can be made to the description in the above-described publications.

As the photopolymerization initiator, a known compound can be optionally used. Examples thereof include a halogenated hydrocarbon derivative (for example, a compound having a triazine skeleton, a compound having an oxadiazole skeleton, a compound having a trihalomethyl group, and the like), an acylphosphine compound such as acylphosphine oxide, hexaarylbiimidazole, an oxime compound such as an oxime derivative, an organic peroxide, a thio compound, a ketone compound, an aromatic onium salt, ketoxime ether, an aminoacetophenone compound, hydroxyacetophenone, an azo-based compound, an azide compound, a metallocene compound, an organic boron compound, and an iron arene complex. For the details thereof, reference can be made to the description in paragraphs 0165 to 0182 of JP2016-027357A, the contents of which are incorporated in the present specification.

Examples of the acylphosphine compound include 2,4,6-trimethylbenzoyl-diphenyl-phosphine oxide. Moreover, IRGACURE-819, IRGACURE 1173, and IRGACURE-TPO (trade names; all are manufactured by BASF SE), which are commercially available products, can be used.

In a case of being formulated, the content of the polymerization initiator used in the curable composition is preferably 0.0001% to 5% by mass, more preferably 0.0005% to 3% by mass, and still more preferably 0.01% to 1% by mass in the solid content.

The curable composition may contain one kind of polymerization initiator or may contain two or more kinds thereof In a case where two or more kinds thereof are contained, the total amount thereof is preferably within the above-described range.

<Method for Producing Curable Composition>

The curable composition according to the embodiment of the present invention is prepared by formulating raw materials in a predetermined proportion. The raw materials refer to components which are actively formulated in the curable composition, and in which unintentionally contained components such as impurities are excluded. Specifically, the curable main agent and the solvent are exemplified. Here, the raw materials may be commercially available products or synthetic products. All the raw materials may contain impurities such as metal particles.

As one preferred embodiment of a method for producing the curable composition according to the embodiment of the present invention, a producing method including subjecting at least one kind of raw materials contained in the curable composition to a filtration treatment with a filter can be mentioned. In addition, it is also preferable that two or more kinds of raw materials are mixed, then filtered with a filter, and mixed with other raw materials (may or may not be filtered). As one more preferred embodiment thereof, an embodiment in which raw materials (preferably, all raw materials) contained in the curable composition are mixed, and then subjected to a filtration treatment with a filter is exemplified.

Effects of filtration are exhibited even with one stage of a filter, but filtration with two or more stages of filters is more preferable. The filtration with two or more stages of filters refers to filtration in a state where two or more filters are arranged in series. In the present invention, filtration with one to five stages of filters is preferable, filtration with one to four stages of filters is more preferable, and filtration with two to four stages of filters is still more preferable.

(Composition for Forming Pattern)

The curable composition according to the embodiment of the present invention is used for forming an interlayer existing between a base material and a curable layer.

The curable layer is not particularly limited, but is preferably a curable layer formed from a composition for forming a pattern.

Moreover, the curable layer is preferably a photocurable layer.

Composition of the composition for forming a pattern is not particularly specified, but it is preferable to contain a polymerizable compound, more preferable to contain a polymerization initiator and a polymerizable compound, still more preferable to contain a radical polymerization initiator and a radically polymerizable compound, and particularly preferable to contain a photoradical polymerization initiator and a radically polymerizable compound.

<Polymerizable Compound>

The composition for forming a pattern preferably contains a polymerizable compound, and it is preferable that a component having the highest content of components contained in the composition for forming a pattern, other than a solvent, is the polymerizable compound. The polymerizable compound may have one polymerizable group or two or more polymerizable groups in one molecule. At least one kind of polymerizable compounds included in the composition for forming a pattern preferably has two to five polymerizable groups, more preferably has two to four polymerizable groups, still more preferably has two or three polymerizable groups, and even more preferably has three polymerizable groups, in one molecule.

The type of the polymerizable group included in the polymerizable compound is not particularly specified, and examples thereof include a group having an ethylenically unsaturated group and a cyclic ether group (an epoxy group, a glycidyl group, and an oxetanyl group). Among them, a group having an ethylenically unsaturated group is preferable. Examples of the group having an ethylenically unsaturated group include a (meth)acryloyl group, a (meth)acryloyloxy group, a (meth)acryloylamino group, a vinyl group, a vinyloxy group, an allyl group, and a vinylphenyl group. Among them, a (meth)acryloyl group or a (meth)acryloyloxy group is more preferable, and an acryloyl group or an acryloyloxy group is still more preferable.

In addition, the polymerizable group included in the polymerizable compound is preferably a group which can react with the polymerizable functional group in the curable main agent in the above-described curable composition.

At least one kind of polymerizable compounds included in the composition for forming a pattern preferably has a cyclic structure. Examples of this cyclic structure include an aliphatic hydrocarbon ring Cf and an aromatic hydrocarbon ring Cr. Among these, the polymerizable compound preferably has the aromatic hydrocarbon ring Cr and more preferably has a benzene ring.

A molecular weight of the polymerizable compound is preferably 100 to 900.

The at least one kind of the above-described polymerizable compounds is preferably represented by Formula (I-1).

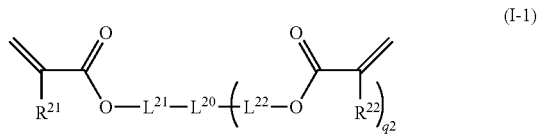

$L^{20}$ is a (1+q2)-valent linking group, and examples thereof include a linking group having a cyclic structure. Examples of the cyclic structure include examples of the ring Cf, the ring Cr, the ring Cn, the ring Co, and the ring Cs.

$R^{21}$ and $R^{22}$ each independently represent a hydrogen atom or a methyl group.

$L^{21}$ and $L^{22}$ each independently represent a single bond or the linking group L. $L^{20}$ and $L^{21}$ or $L^{22}$ may be bonded to each other via or without via the linking group L to form a ring. $L^{20}$, $L^{21}$, and $L^{22}$ may have the substituent T. A plurality of substituents T may be bonded to each other to form a ring. In a case where there are the plurality of substituents T, the plurality of substituents T may be the same or different from each other.

q2 is an integer of 0 to 5, preferably an integer of 0 to 3, more preferably an integer of 0 to 2, and still more preferably 0 or 1.

[High-Molecular-Weight Polymerizable Compound]

Moreover, the composition for forming a pattern may contain, as the polymerizable compound, a polymerizable compound having a weight-average molecular weight of 800 or more (hereinafter, also referred to as a "high-molecular-weight polymerizable compound").

By using the high-molecular-weight polymerizable compound, a transfer of the polymerization inhibitor from the interlayer to the curable layer is easily suppressed, and it is presumed that the pattern defects are easily suppressed.

Examples of the high-molecular-weight polymerizable compound include a compound (silicon-containing compound) containing a silicon atom (Si), a compound (ring-containing compound) containing a cyclic structure, and a dendrimer-type compound, and a silicon-containing compound or a ring-containing compound is preferable and a silicon-containing compound is more preferable.

A weight-average molecular weight of the high-molecular-weight polymerizable compound is 800 or more, preferably 1,000 or more, more preferably 1,500 or more, and still more preferably more than 2,000. The upper limit of the weight-average molecular weight is not particularly specified, but for example, 100,000 or less is preferable, 50,000 or less is more preferable, 10,000 or less is still more preferable, 8,000 or less is even more preferable, 5,000 or less is even still more preferable, 3,500 or less is particularly preferable, and 3,000 or less is more particularly preferable. By setting the molecular weight to the above-described lower limit value or more, a volatilization of the compound is suppressed, and characteristics of the composition or a coating film are stabilized. Moreover, good viscosity for maintaining a morphology of the coating film can be ensured. Further, it is possible to realize good releasability of the film by complementing the effect of suppressing a release agent to a small amount. By setting the molecular weight to the above-described upper limit value or less, it is easy to secure a low viscosity (fluidity) required for pattern filling, which is preferable.

—Silicon-Containing Compound—

Examples of the silicon-containing compound include a compound having a silicone skeleton. Specific examples thereof include a compound having at least one of a D-unit siloxane structure represented by Formula (S1) or a T-unit siloxane structure represented by Formula (S2).

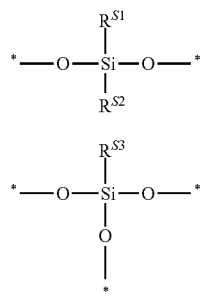

In Formula (S1) or Formula (S2), $R^{S1}$ to $R^{S3}$ each independently represent a hydrogen atom or a monovalent substituent, and *'s each independently represent a bonding site with other structures.

$R^{S1}$ to $R^{S3}$ are each independently preferably a monovalent substituent.

As the above-described monovalent substituent, an aromatic hydrocarbon group (preferably having 6 to 22 carbon atoms, more preferably having 6 to 18 carbon atoms, and still more preferably having 6 to 10 carbon atoms) or an aliphatic hydrocarbon group (preferably having 1 to 24 carbon atoms, more preferably having 1 to 12 carbon atoms, and still more preferably having 1 to 6 carbon atoms) is preferable, and among them, a cyclic or chain (linear or branched) alkyl group (preferably having 1 to 12 carbon atoms, more preferably having 1 to 6 carbon atoms, and still more preferably having 1 to 3 carbon atoms) or a group including a polymerizable group is preferable.

Specific examples of a structure of the silicon-containing compound include the following examples of Formulae (s-1) to (s-9) in terms of partial structure. Q in the formulae is a group including the above-described polymerizable group. A plurality of these structures may be present in the compound, or may be present in combination.

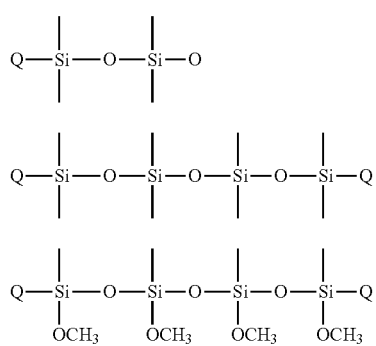

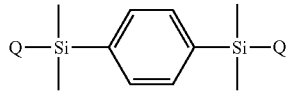

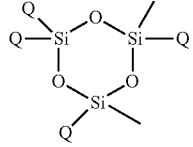

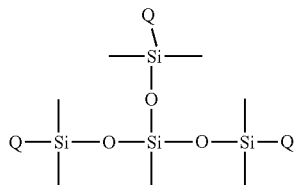

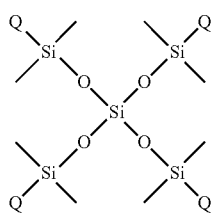

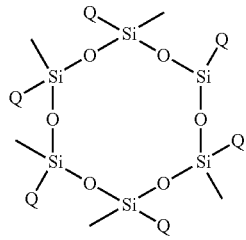

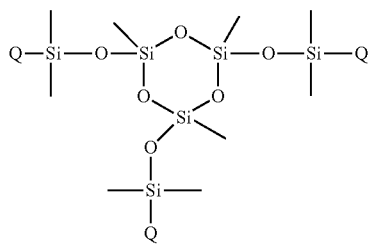

The silicon-containing compound is preferably a reactant of a silicone resin and a compound having a polymerizable group.

As the above-described silicone resin, a reactive silicone resin is preferable.

Examples of the reactive silicone resin include a modified silicone resin having the above-described silicone skeleton, and for example, a monoamine-modified silicone resin, a diamine-modified silicone resin, a special amino-modified silicone resin, an epoxy-modified silicone resin, an alicyclic epoxy-modified silicone resin, a carbinol-modified silicone resin, a mercapto-modified silicone resin, a carboxy-modified silicone resin, a hydrogen-modified silicone resin, an amino-polyether-modified silicone resin, an epoxy-polyether-modified silicone resin, an epoxy-aralkyl-modified silicone resin, and the like can be mentioned.

As the above-described having a polymerizable group, a compound having a polymerizable group and a group capable of reacting with an alkoxysilyl group or a silanol group is preferable, and a compound having a polymerizable group and a hydroxy group is more preferable.

Moreover, in a case where the above-described modified silicone resin is used as the silicone resin, as the above-described compound having a polymerizable group, a compound having a polymerizable group and a group which reacts with an amino group, an epoxy group, a mercapto group, a carboxy group, and the like, which are included in the above-described modified silicone resin, may be used.

A preferred aspect of the polymerizable group in the above-described compound having a polymerizable group is the same as the preferred aspect of the polymerizable group in the above-described polymerizable compound.

As the above-described compound having a polymerizable group, among them, hydroxyalkyl (meth)acrylate is preferable, and 2-hydroxyethyl (meth)acrylate is more preferable.

More specifically, a reactant of a compound having a polymerizable group and a group (for example, a hydroxy group) capable of reacting with an alkoxysilyl group or a silanol group and a silicone resin having an alkoxysilyl group or a silanol group is preferable.

—Ring-Containing Compound—

Examples of a cyclic structure of the compound (ring-containing compound) containing a ring include an aromatic ring and an alicyclic ring. Examples of the aromatic ring include an aromatic hydrocarbon ring and an aromatic heterocyclic ring.

The aromatic hydrocarbon ring preferably has 6 to 22 carbon atoms, more preferably has 6 to 18 carbon atoms, and still more preferably has 6 to 10 carbon atoms. Specific examples of the aromatic hydrocarbon ring include a benzene ring, a naphthalene ring, an anthracene ring, a phenanthrene ring, a phenalene ring, a fluorene ring, a benzocyclooctene ring, an acenaphthylene ring, a biphenylene ring, an indene ring, an indane ring, a triphenylene ring, a pyrene ring, a chrysene ring, a perylene ring, and a tetrahydronaphthalene ring. Among them, a benzene ring or a naphthalene ring is preferable, and a benzene ring is more preferable. The aromatic ring may have a structure in which a plurality of rings is linked to each other, and examples thereof include a biphenyl structure and a diphenylalkane structure (for example, 2,2-diphenylpropane) (the aromatic hydrocarbon ring specified here is referred to as aCy).

The aromatic heterocyclic ring preferably has 1 to 12 carbon atoms, more preferably has 1 to 6 carbon atoms, and still more preferably has 1 to 5 carbon atoms. Specific examples thereof include a thiophene ring, a furan ring, a dibenzofuran ring, a pyrrole ring, an imidazole ring, a benzimidazole ring, a pyrazole ring, a triazole ring, a tetrazole ring, a thiazole ring, a thiadiazole ring, an oxadiazole ring, an oxazole ring, a pyridine ring, a pyrazine ring, a pyrimidine ring, a pyridazine ring, an isoindole ring, an indole ring, an indazole ring, a purine ring, a quinolidine ring, an isoquinoline ring, a quinoline ring, a phthalazine ring, a naphthylidine ring, a quinoxaline ring, a quinazoline ring, a cinnoline ring, a carbazole ring, an aclysine ring, a phenazine ring, a phenothiazine ring, a phenoxathiin ring, and a phenoxazine ring (the aromatic heterocyclic ring specified here is referred to as hCy).

The alicyclic ring preferably has 3 to 22 carbon atoms, more preferably has 4 to 18 carbon atoms, and still more preferably has 6 to 10 carbon atoms. Specific examples of the aliphatic hydrocarbon ring include a cyclopropane ring, a cyclobutane ring, a cyclobutene ring, a cyclopentane ring, a cyclohexane ring, a cyclohexene ring, a cycloheptane ring, a cyclooctane ring, a dicyclopentadiene ring, a spirodecane ring, a spirononane ring, a tetrahydrodicyclopentadiene ring, an octahydronaphthalene ring, a decahydronaphthalene ring, a hexahydroindane ring, a bornane ring, a norbornane ring, a norbornene ring, a isobornane ring, a tricyclodecane ring, a tetracyclododecane ring, and an adamantane ring. Examples of the aliphatic hetero ring include a pyrrolidine ring, an imidazolidine ring, a piperidine ring, a piperazine ring, a morpholine ring, an oxirane ring, an oxetane ring, an oxorane ring, an oxane ring, and a dioxane ring (the alicyclic ring specified here is referred to as fCy).

In the present invention, in a case where the high-molecular-weight polymerizable compound is a ring-containing compound, a compound containing an aromatic hydrocarbon ring is preferable, and a compound having a benzene ring is more preferable. Examples thereof include a compound having a structure represented by Formula (C-1).

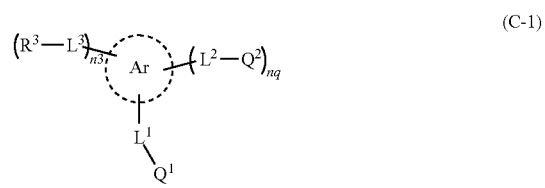

(C-1)

In the formula, Ar represents the above-described aromatic hydrocarbon ring or aromatic heterocyclic ring.

$L^1$ and $L^2$ are each independently a single bond or a linking group. Examples of the linking group include an oxygen atom (oxy group), a carbonyl group, an amino group, an alkylene group (preferably having 1 to 12 carbon atoms, more preferably having 1 to 6 carbon atoms, and still more preferably 1 to 3 carbon atoms), and a group of a combination of these groups. Among them, a (poly)alkyleneoxy group is preferable. The (poly)alkyleneoxy group may be a group having one alkyleneoxy group or a group in which a plurality of alkyleneoxy groups is repeatedly linked. Moreover, an order of the alkylene group and the oxy group is not limited. The repetition number of the alkyleneoxy group is preferably 1 to 24, more preferably 1 to 12, and still more preferably 1 to 6. Moreover, the (poly)alkyleneoxy group may be intervened with an alkylene group (preferably having 1 to 24 carbon atoms, more preferably having 1 to 12 carbon atoms, and still more preferably having 1 to 6 carbon atoms) in relation to the ring Ar which is a mother nucleus or the polymerizable group Q. Therefore, (poly)alkyleneoxy=alkylene group may be used.

$R^3$ is an optional substituent, and examples thereof include an alkyl group (preferably having 1 to 12 carbon atoms, more preferably having 1 to 6 carbon atoms, and still more preferably having 1 to 3 carbon atoms), an alkenyl group (preferably having 2 to 12 carbon atoms, more preferably having 2 to 6 carbon atoms, and still more preferably having 2 or 3 carbon atoms), an aryl group (preferably having 6 to 22 carbon atoms, more preferably having 6 to 18 carbon atoms, and still more preferably having 6 to 10 carbon atoms), an arylalkyl group (preferably having 7 to 23 carbon atoms, more preferably having 7 to 19 carbon atoms, and still more preferably having 7 to 11 carbon atoms), a hydroxy group, a carboxy group, an alkoxy group (preferably having 1 to 24 carbon atoms, more preferably having 1 to 12 carbon atoms, and still more preferably having 1 to 6 carbon atoms), an acyl group (preferably having 2 to 12 carbon atoms, more preferably having 2 to 6 carbon atoms, and still more preferably having 2 or 3 carbon atoms; also preferably an alkylcarbonyl group), and an aryloyl group (preferably having 7 to 23 carbon atoms, more preferably having 7 to 19 carbon atoms, and still more preferably having 7 to 11 carbon atoms).

$L^3$ is a single bond or a linking group. Examples of the linking group include the examples of $L^1$ and $L^2$ described above.

n3 is preferably 3 or less, more preferably 2 or less, still more preferably 1 or less, and particularly preferably 0.

$Q^1$ and $Q^2$ are each independently a polymerizable group, and the example of the above-described polymerizable group is preferable.

In the ring-containing compound, in a case where the number of side chains having a polymerizable group is increased, it is possible to form a strong crosslinking structure during curing, and the resolution tends to be improved. From this viewpoint, nq is 1 or more, preferably 2 or more. The upper limit thereof is preferably 6 or less, more preferably 4 or less, and still more preferably 3 or less.

Similarly, from the viewpoint of easily forming a uniform crosslinking structure, in a case where a group including a polymerizable group or a substituent is introduced into the cyclic structure, it is preferable that the substituents are arranged in series.

—Dendrimer-Type Compound—The high-molecular-weight polymerizable compound may be a dendrimer-type compound. The dendrimer means a dendritic polymer having a structure which branches regularly from a center. The dendrimer is composed of a central molecule (stem) called as a core and a side chain portion (branch) called as a dendron. As a whole, a fan-shaped compound is common, but a dendrimer in which dendrons are spread in a semicircular or circular shape may be used. A group having a polymerizable group can be introduced into a dendron portion (for example, a terminal portion away from the core) of the dendrimer to obtain the polymerizable compound. In a case where a (meth)acryloyl group is used as the polymerizable group to be introduced, a dendrimer-type polyfunctional (meth)acrylate can be obtained.

For the dendrimer-type compound, for example, matters described in JP5512970B can be referred to, the description of which is incorporated in the present specification.

—Polymerizable Group Equivalent—

A polymerizable group equivalent of the high-molecular-weight polymerizable compound is preferably 130 or more, more preferably 150 or more, still more preferably 160 or more, even more preferably 190 or more, and even still more preferably 240 or more. The upper limit value of the polymerizable group equivalent is preferably 2,500 or less, more preferably 1,800 or less, still more preferably 1,000 or less, even more preferably 500 or less, and even still more preferably 350 or less, and may be 300 or less.

The polymerizable group equivalent is calculated by the following expression.

(Polymerizable group equivalent)=(Number-average molecular weight of polymerizable compound)/ (Number of polymerizable groups in polymerizable compound)

In a case where the polymerizable group equivalent of the high-molecular-weight polymerizable compound is the above-described lower limit value or more, it is considered that the elastic modulus during curing is in an appropriate range and the releasability is excellent. On the other hand, in a case where the polymerizable group equivalent is the above-described upper limit value or less, it is considered that a crosslink density of the cured substance pattern is in an appropriate range and the resolution of the transfer pattern is excellent.

In a case of the silicon-containing compound, the number of polymerizable groups in the high-molecular-weight polymerizable compound is preferably 2 or more, more preferably 3 or more, and still more preferably 4 or more in one molecule. The upper limit thereof is preferably 50 or less, more preferably 40 or less, still more preferably 30 or less, and even more preferably 20 or less.

In a case of the ring-containing compound, it is preferable to be 2 or more in one molecule. The upper limit thereof is preferably 4 or less and more preferably 3 or less.

Alternatively, in a case of the dendrimer-type compound, it is preferable to be 5 or more, more preferably 10 or more, and still more preferably 20 or more in one molecule. The upper limit thereof is preferably 1,000 or less, more preferably 500 or less, and still more preferably 200 or less.

—Viscosity—

A viscosity of the high-molecular-weight polymerizable compound at 23° C. is preferably 100 mPa·s or greater, more preferably 120 mPa·s or greater, and still more preferably 150 mPa·s or greater. The upper limit value of the above-described viscosity is preferably 2,000 mPa·s or lower, more preferably 1,500 mPa·s or lower, and still more preferably 1,200 mPa·s or lower.

Unless otherwise specified, the viscosity in the present specification is a value measured with an E-type rotational viscometer RE85L manufactured by TOKI SANGYO CO., LTD. and a standard cone rotor (1°34'×R24) in a state where a temperature of a sample cup is adjusted to 23° C. Other details regarding the measurement are in accordance with JIS Z 8803:2011. Two samples are produced for one level and are respectively measured three times. An arithmetic mean value of a total of six times is adopted as an evaluation value.

Examples of the polymerizable compound include compounds used in the following Examples, the compounds described in paragraphs 0017 to 0024 and Examples of JP2014-090133A, the compounds described in paragraphs 0024 to 0089 of JP2015-009171A, the compounds described in paragraphs 0023 to 0037 of JP2015-070145A, and the compounds described in paragraphs 0012 to 0039 of WO2016/152597A, but the present invention is not construed as being limited thereto.

With respect to the total solid content of the composition for forming a pattern, a content of the polymerizable compound is preferably 30% by mass or greater, more preferably 45% by mass or greater, still more preferably 50% by mass or greater, and even more preferably 55% by mass or greater, and may be 60% by mass or more or further 70% by mass or more. In addition, the upper limit value thereof is preferably lower than 99% by mass and more preferably 98% by mass or lower, and can also be 97% by mass or lower.

It is preferable that a boiling point of the polymerizable compound is set and designed on formulation in relation to the curable main agent included in the above-described curable composition. The boiling point of the polymerizable compound is preferably 500° C. or lower, more preferably 450° C. or lower, and still more preferably 400° C. or lower. The lower limit value thereof is preferably 200° C. or higher, more preferably 220° C. or higher, and still more preferably 240° C. or higher.

[Other Components]

The composition for forming a pattern may contain an additive other than the polymerizable compound. A polymerization initiator, a solvent, a surfactant, a sensitizer, a release agent, an antioxidant, a polymerization inhibitor, and the like may be contained as other additives.

Specific examples of the composition for forming a pattern, which can be used in the present invention, include the compositions described in JP2013-036027A, JP2014-090133A, and JP2013-189537A, the contents of which are incorporated in the present specification. In addition, also regarding preparation of the composition for forming a pattern and a pattern producing method, reference can be made to the descriptions in the above-described publications, the contents of which are incorporated in the present specification.

In the present invention, a content of the solvent in the composition for forming a pattern is preferably 5% by mass or lower, more preferably 3% by mass or lower, and still more preferably 1% by mass or lower with respect to the total mass of the composition for forming a pattern. The lower limit of the above-described content of the solvent is not limited, and may be 0% by mass.

In addition, the high-molecular-weight polymerizable compound is used as the polymerizable compound in the composition for forming a pattern, an aspect in which the content of the solvent is 30% by mass or greater with respect to the total mass of the composition for forming a pattern is also preferable. The above-described content thereof is preferably 50% by mass or greater and more preferably 60% by mass or greater.

Examples of the solvent contained in the composition for forming a pattern include the solvents exemplified as the solvent for the curable composition, which contained in the above-described curable composition, and a preferred aspect thereof is also the same.

The composition for forming a pattern may also be an aspect in which a high-molecular-weight compound is not substantially contained.

Specifically, it is preferable that a compound having a molecular weight (in a case of having a molecular weight distribution, a weight-average molecular weight) of 2,000 or more is not substantially contained, and it is more preferable that a compound having a molecular weight (in a case of having a molecular weight distribution, a weight-average molecular weight) of 1,000 or more is not substantially contained.

The fact that the high-molecular-weight compound is not substantially contained means that, for example, the content of the high-molecular-weight compound is 0.01% by mass or lower with respect to the composition for forming a pattern, and it is preferable that the content thereof is 0.005% by mass or lower and it is more preferable that the high-molecular-weight compound is not contained at all.

[Physical Property Value and the Like]

A viscosity of the composition for forming a pattern is preferably 20.0 mPa·s or lower, more preferably 15.0 mPa·s or lower, still more preferably 11.0 mPa·s or lower, and even more preferably 9.0 mPa·s or lower. The lower limit value of the viscosity is not particularly limited, but can be, for example, 5.0 mPa·s or greater. The viscosity can be measured by a known method, and for example, is measured according to the following method.

The viscosity is measured using an E-type rotational viscometer RE85L manufactured by TOKI SANGYO CO., LTD. and a standard cone rotor (1°34'×R24) in a state where a temperature of a sample cup is adjusted to 23° C. The unit is mPa·s. Other details regarding the measurement are in accordance with JIS Z 8803:2011. Two samples are produced for one level and are respectively measured three times. An arithmetic mean value of a total of six times is adopted as an evaluation value.

A surface tension ($\gamma$Resist) of the composition for forming a pattern is preferably 28.0 mN/m or greater and more preferably 30.0 mN/m or greater, and may be 32.0 mN/m or greater. By using the composition which has high surface tension, a capillary force is increased, and the composition can be filled into a mold pattern at high speed. The upper limit value of the surface tension is not particularly limited, but from the viewpoint of relation to the interlayer and of imparting ink jet suitability, is preferably 40.0 mN/m or lower and more preferably 38.0 mN/m or lower, and may be 36.0 mN/m or lower.

The surface tension of the composition for forming a pattern is measured according to the same method as the measuring method for the alkylene glycol compound.

An Ohnishi parameter of the composition for forming a pattern is preferably 5.0 or less, more preferably 4.0 or less, and still more preferably 3.7 or less. The lower limit value of the Ohnishi parameter of the composition for forming a pattern is not particularly specified, but may be, for example, 1.0 or more or further 2.0 or more.

For the solid content of the composition for forming a pattern, the Ohnishi parameter can be determined by substituting the number of carbon atoms, the number of hydrogen atoms, and the number of oxygen atoms in all the constituent components into the following expression, respectively.

Ohnishi parameter=Sum of number of carbon atoms, number of hydrogen atoms, and number of oxygen atoms/(Number of carbon atoms−Number of oxygen atoms)

<Preservation Container>

As a storage container of the curable composition and the composition for forming a pattern used in the present invention, a storage container known in the related art can be used. Moreover, as the storage container, for the purpose of suppressing impurities from being mixed into a raw material or a composition, a multilayer bottle having a container interior wall made of six layers of six kinds of resins or a bottle having a seven-layer structure of six kinds of resins is also preferably used. Examples of such a container include the container described in JP2015-123351A.

(Kit)

A kit according to an embodiment of the present invention includes the curable composition according to the embodiment of the present invention and a composition for forming a pattern, which includes a polymerizable compound.

Details of the curable composition and the composition for forming a pattern are as described above.

With the kit according to the embodiment of the present invention, storage stability of the curable composition is excellent, and a generation of defects of a pattern formed of the composition for forming a pattern, which is formed on the interlayer, is suppressed.

(Interlayer and Laminate)

An interlayer according to an embodiment of the present invention is an interlayer formed from the curable composition according to the embodiment of the present invention.

In addition, a laminate according to an embodiment of the present invention is a laminate including a base material and the interlayer formed from the curable composition according to the embodiment of the present invention.

The above-described interlayer and the above-described laminate are manufactured, for example, by an interlayer-forming step in the imprint pattern producing method described later.

(Imprint Pattern Producing Method)

An imprint pattern producing method according to an embodiment of the present invention includes a curable layer-forming step of applying a composition for forming a pattern to a member to be applied, which is selected from the group consisting of the laminate according to the embodiment of the present invention and a mold, a contact step of contacting a member which is not selected as the member to be applied from the group consisting of the laminate and the mold with the composition for forming a pattern as a contact member, a curing step of forming a cured substance with the composition for forming a pattern, and a peeling step of peeling off the cured substance from the mold.

The imprint pattern producing method according to the embodiment of the present invention may further include an interlayer-forming step of forming an interlayer on a base material. The laminate including the base material and the interlayer, which is obtained by the interlayer-forming step, corresponds to the laminate according to the embodiment of the present invention.

<Interlayer-Forming Step>

In the interlayer-forming step, an interlayer is formed on a surface of a base material. The interlayer is preferably formed by applying the curable composition according to the embodiment of the present invention in a layered manner to the base material. An undercoat layer, a closely attached layer, or the like other than the interlayer may be formed on the surface of the base material.

A method for applying the curable composition to the surface of the base material is not particularly specified, and generally known application methods can be adopted. Specific examples of the application method include a dip coating method, an air knife coating method, a curtain coating method, a wire bar coating method, a gravure coating method, an extrusion coating method, a spin coating method, a slit scanning method, and an ink jet method, and a spin coating method is preferable.

In addition, after the curable composition is applied in a layered manner to the base material, it is preferable that the solvent is volatilized (dried) by heat to form the interlayer which is a thin film.

A thickness of the interlayer is preferably 2 nm or greater, more preferably 3 nm or greater, and still more preferably 4 nm or greater, and may be 5 nm or greater, 7 nm or greater, or 10 nm or greater. Moreover, the thickness of the interlayer is preferably 40 nm or lower, more preferably 30 nm or lower, still more preferably 20 nm or lower, and may be 15 nm or lower. By setting the film thickness to be equal to or greater than the above-described lower limit value, extendability (wettability) of the composition for forming a pattern on the interlayer is improved, and it is possible to form a residual film in a nearly uniform state after imprinting. By setting the film thickness to be equal to or less than the above-described upper limit value, the thickness of the residual film after imprinting is reduced, the film thickness unevenness is less likely to occur, and thus uniformity of the residual film tends to be improved.

A material of the base material is not particularly specified, and reference can be made to the description in paragraph 0103 of JP2010-109092A, the contents of which are incorporated in the present specification. In the present invention, examples thereof include a silicon base material, a glass base material, a quartz base material, a sapphire base material, a silicon carbide base material, a gallium nitride base material, an aluminum base material, an amorphous aluminum oxide base material, a polycrystalline aluminum oxide base material, spin-on carbon (SOC), spin-on glass (SOG), silicon nitride, silicon oxynitride, and a base material composed of GaAsP, GaP, AlGaAs, InGaN, GaN, AlGaN, ZnSe, AlGa, InP, or ZNo. Furthermore, specific examples of a material for the glass base material include aluminosilicate glass, aluminoborosilicate glass, and barium borosilicate glass. In the present invention, a silicon base material or a base material on which an spin-on carbon (SOC) layer is formed is preferable.

As the base material, it is preferable to use a plate-shaped base material (also referred to as a "substrate").

As the silicon base material, a surface-modified silicon base material can be appropriately used, and a silicon base material in which the carbon content in the region from the surface of the base material to the thickness of 10 nm (more preferably, the thickness of 100 nm) is 70% by mass or greater (preferably, 80% to 100% by mass) may be used. Examples thereof include a base material which has a spin-on carbon (SOC) film having a film thickness of 200 nm and is obtained by applying various spin-on carbon films to a silicon base material by a spin coating method and performing baking at 240° C. for 60 seconds. In recent years, stable mold patterning has been required even on the surfaces of such various SOC base materials, and according to the present invention, favorable adhesiveness between such a base material and a layer formed of a curable composition can be ensured, and stable mold patterning which prevents the base material from peeling off is achieved.

In the present invention, it is preferable to use a base material having an organic layer as an outermost layer.

Examples of the organic layer of the base material include an amorphous carbon film formed by chemical vapor deposition (CVD), and a spin-on carbon film formed by dissolving a high-carbon material in an organic solvent and performing spin coating. Examples of the spin-on carbon film include a nortricyclene copolymer, a hydrogenated naphthol novolac resin, a naphthol dicyclopentadiene copolymer, a phenol dicyclopentadiene copolymer, the fluorene bisphenol novolac described in JP2005-128509A, the acenaphthylene copolymer described in JP2005-250434A, an indene copolymer, the fullerene having a phenol group described in JP2006-227391A, a bisphenol compound and a novolac resin thereof, a dibisphenol compound and a novolac resin thereof, a novolac resin of an adamantane phenol compound, a hydroxyvinylnaphthalene copolymer, the bisnaphthol compound and the novolac resin thereof described in JP2007-199653A, and resin compounds shown in ROMP and a tricyclopentadiene copolymerized substance.

For examples of the SOC, reference can be made to the description in paragraph 0126 of JP2011-164345A, the contents of which are incorporated in the present specification.

A contact angle of the surface of the base material to water is preferably 20° or higher, more preferably 40° or higher, and still more preferably 60° or higher. The upper limit thereof is preferably 90° or lower. The contact angle is measured according to a method described in Examples described later.

In the present invention, it is also preferable to use a base material (hereinafter, referred to as a basic base material) having a basic layer as an outermost layer. Examples of the basic base material include a base material containing a basic organic compound (for example, an amine-based compound, an ammonium-based compound, or the like), and an inorganic base material containing a nitrogen atom.

A surface free energy of the interlayer is preferably 30 mN/m or greater, more preferably 40 mN/m or greater, and still more preferably 50 mN/m or greater. The upper limit thereof is preferably 200 mN/m or lower, more preferably 150 mN/m or lower, and still more preferably 100 mN/m or lower.

The surface free energy can be measured at 23° C. using a surface tensiometer SURFACE TENS-IOMETER CBVP-A3 manufactured by Kyowa Interface Science Co., LTD. and a glass plate.

[Curable Layer-Forming Step]

The imprint pattern producing method according to the embodiment of the present invention includes a curable layer-forming step of applying the composition for forming a pattern to a member to be applied, which is selected from the group consisting of the laminate according to the embodiment of the present invention and a mold.

In the curable layer-forming step, one member selected from the group consisting of the laminate and the mold is selected as the member to be applied, and the composition for forming a pattern is applied to the selected member to be applied.

Among the laminate and the mold, one is selected as the member to be applied and the other is a contact member.

That is, in the curable layer-forming step, the composition for forming a pattern may be applied to the laminate and then brought into contact with the mold, or may be applied to the mold and then brought into contact with the laminate.

—Laminate—

It is sufficient that the laminate is the laminate according to the embodiment of the present invention, and it is more preferable that the laminate is obtained by the above-described interlayer-forming step.

The above-described laminate may further include a liquid film on a surface of the interlayer opposite to the base material.

The liquid film is preferably a liquid film formed by applying a composition for forming a liquid film, which will be described later, to the interlayer.

—Mold—

In the present invention, the mold is not particularly limited. Regarding the mold, reference can be made to the description in paragraphs 0105 to 0109 of JP2010-109092A (the corresponding US application is the specification of US2011/0199592A), the contents of which are incorporated in the present specification. As the mold used in the present invention, a quartz mold is preferable. A pattern (line width) of the mold used in the present invention preferably has a size of 50 nm or less. The pattern of the mold can be formed according to a desired processing accuracy, for example, by photolithography, an electron beam drawing method, or the like, but in the present invention, a mold pattern producing method is not particularly limited.

—Applying Method—

A method for applying the composition for forming a pattern to the member to be applied is not particularly specified, and generally known application methods can be adopted. Examples thereof include a dip coating method, an air knife coating method, a curtain coating method, a wire bar coating method, a gravure coating method, an extrusion coating method, a spin coating method, a slit scanning method, and an ink jet method.

Among them, preferred examples thereof include an ink jet method and a spin coating method.

In addition, the composition for forming a pattern may be applied through multiple applying.

In a method of arranging liquid droplets by the ink jet method, an amount of the liquid droplets is preferably approximately 1 to 20 pL, and the liquid droplets are preferably arranged on the surface of a base material at an interval between liquid droplets. The interval between liquid droplets may be appropriately set according to the amount of the liquid droplets, and is preferably an interval of 10 to 1,000 μm. In a case of the ink jet method, the interval between liquid droplets is an arrangement interval between ink jet nozzles.

The ink jet method has an advantage that a loss of the composition for forming a pattern is small.

Specific examples of the method for applying the composition for forming a pattern by the ink jet method include the methods described in JP2015-179807A, WO2016/152597A, and the like, and the methods described in these documents can also be suitably used in the present invention.

On the other hand, the spin coating method has an advantage that the coating process is highly stable and the choice of materials which can be used is expanded.

Specific examples of the method for applying the composition for forming a pattern by the spin coating method include the methods described in JP2013-095833A, JP2015-071741A, and the like, and the methods described in these documents can also be suitably used in the present invention.

—Drying Step—

Moreover, the imprint pattern producing method according to the embodiment of the present invention may further include a drying step of drying the composition for forming a pattern according to the embodiment of the present invention applied in the applying step.

In particular, in a case where a composition including a solvent is used as the composition for forming a pattern, it is preferable that the imprint pattern producing method according to the embodiment of the present invention includes the drying step.

In the drying step, at least a part of the solvent included in the composition for forming a pattern applied is removed.

A drying method is not particularly limited, and drying by heating, drying by blowing air, or the like can be used without particular limitation, but drying by heating is preferable.

A heating unit is not particularly limited, and a well-known hot plate, oven, infrared heater, or the like can be used.

In the present invention, a layer formed from the composition for forming a pattern after the applying step and the drying step performed as necessary and before the contact step is also referred to as a "pattern forming layer".

[Contact Step]

The imprint pattern producing method according to the embodiment of the present invention includes a contact step of contacting a member which is not selected as the member to be applied from the group consisting of the laminate and the mold with the composition for forming a pattern (pattern forming layer) as a contact member.

In a case where the laminate is selected as the member to be applied in the above-described applying step, in the contact step, the mold, which is the contact member, is brought into contact with the surface of the laminate to which the composition for forming a pattern is applied (surface on which the pattern forming layer is formed).

In a case where the mold is selected as the member to be applied in the above-described applying step, in the contact step, a surface of the laminate on which the interlayer is formed, which is the contact member, is brought into contact with the surface of the mold to which the composition for forming a pattern is applied (surface on which the pattern forming layer is formed).

That is, in a case where the mold is selected as the member to be applied in the above-described applying step, by the contact step, the interlayer according to the present invention exists between the base material and the curable layer (the pattern forming layer after the contact step).

Details of the laminate and the mold are as described above.

In a case where the composition for forming a pattern of the present invention (pattern forming layer) which is applied to the member to be applied is brought into contact with the contact member, a pressing pressure is preferably 1 MPa or lower. By setting the pressing pressure to 1 MPa or lower, the laminate or the mold is less likely to be deformed and thus the pattern accuracy tends to be improved. Moreover, also from the viewpoint that a device tends to be miniaturized due to low pressing force, the above-described range is preferable.

In addition, it is also preferable that the contact between the pattern forming layer and the contact member is performed under an atmosphere including a helium gas, a condensable gas, or both a helium gas and a condensable gas.

[Curing Step]

The imprint pattern producing method according to the embodiment of the present invention includes a curing step of forming a cured substance with the composition for forming a pattern.

The curing step is performed after the above-described contact step and before the above-described peeling step.

Examples of a curing method include curing by heating and curing by exposure, which may be determined according to the type of the polymerization initiator included in the composition for forming a pattern, and curing by exposure is preferable.

For example, in a case where the above-described polymerization initiator is a photopolymerization initiator, the composition for forming a pattern can be cured by performing exposure in the curing step.

An exposure wavelength is not particularly limited, and may be determined according to the polymerization initiator. For example, ultraviolet light or the like can be used.

An exposure light source may be determined according to the exposure wavelength, and examples thereof include g-rays (wavelength: 436 nm), h-rays (wavelength: 405 nm), i-rays (wavelength: 365 nm), broadband light (light including at least two wavelengths of light selected from the group consisting of three wavelengths of g-rays, h-rays, and i-rays; examples thereof include a high-pressure mercury lamp in a case where an optical filter is not used), semiconductor laser (wavelength: 830 nm, 532 nm, 488 nm, 405 nm, and the like), metal halide lamp, excimer laser, KrF excimer laser (wavelength: 248 nm), ArF excimer laser (wavelength: 193 nm), $F_2$ excimer laser (wavelength: 157 nm), extreme ultraviolet rays (EUV; wavelength: 13.6 nm), and electron beam.

Among them, preferred examples thereof include exposure using i-rays or broadband light.

An irradiation amount (exposure amount) during the exposure may be sufficiently larger than the minimum irradiation amount required for curing the composition for forming a pattern. The irradiation amount required for curing the composition for forming a pattern can be appropriately determined by examining consumption or the like of an unsaturated bond of the composition for forming a pattern.

The exposure amount is, for example, preferably in a range of 5 to 1,000 mJ/cm$^2$ and more preferably in a range of 10 to 500 mJ/cm2.

An exposure illuminance is not particularly limited and may be selected depending on a relationship with the light source, but is preferably in a range of 1 to 500 mW/cm$^2$ and more preferably in a range of 10 to 400 mW/cm$^2$.

An exposure time is not particularly limited and may be determined in consideration of the exposure illuminance according to the exposure amount, but is preferably 0.01 to 10 seconds and more preferably 0.5 to 1 second.

A temperature of the base material during the exposure is usually room temperature, but in order to increase reactivity, the exposure may be performed while heating. Since setting a vacuum state as a stage prior to the exposure is effective in preventing air bubbles from being mixed, suppressing a decrease in reactivity due to oxygen mixing, and improving adhesiveness between the mold and the composition for forming a pattern, the exposure may be performed in a vacuum state. Moreover, a preferred degree of vacuum during the light irradiation is in a range of $10^{-1}$ Pa to normal pressure.

After the exposure, as necessary, the composition for forming a pattern after the exposure may be heated. A heating temperature is preferably 150° C. to 280° C. and more preferably 200° C. to 250° C. Moreover, a heating time is preferably 5 to 60 minutes and more preferably 15 to 45 minutes.

In addition, in the curing step, only the heating step may be performed without exposure. For example, in a case where the above-described polymerization initiator is a thermal polymerization initiator, the composition for forming a pattern can be cured by performing heating in the curing step. A preferred aspect of the heating temperature and heating time in this case are the same as in the heating temperature and heating time in the case of heating after the above-described exposure.

A heating unit is not particularly limited, and examples thereof include the same heating unit as in the heating of the above-described drying step.

[Peeling Step]

The imprint pattern producing method according to the embodiment of the present invention includes a peeling step of peeling off the cured substance from the mold.

By the peeling step, the cured substance obtained in the curing step is peeled off from the mold, and a cured substance in a patterned shape (also referred to as a "cured substance pattern") to which the pattern of the mold is transferred can be obtained. The obtained cured substance pattern can be used for various uses as described later. In the present invention, the pattern producing method is particularly advantageous in that a fine cured substance pattern of a nano order can be formed, and a cured substance pattern having a size of 50 nm or lower and particularly 30 nm or lower can also be formed. The lower limit value of the size of the cured substance pattern formed by the pattern producing method according to the embodiment of the present invention is not particularly specified, but can be, for example, 1 nm or greater.

A peeling method is not particularly limited, and for example, the peeling can be performed by using a mechanical release device or the like known in the imprint pattern producing method.

(Method for Manufacturing Device and Application of Cured Substance Pattern)

A method for manufacturing a device according to an embodiment of the present invention includes the imprint pattern producing method according to the embodiment of the present invention.

Specifically, a pattern (cured substance pattern) formed by the imprint pattern producing method according to the embodiment of the present invention can be used in a method for manufacturing a device such as a permanent film used in a liquid crystal display device (LCD) or the like, or an etching resist (mask for lithography) for manufacturing a semiconductor element.

In particular, the present invention discloses a method for manufacturing a circuit board, which includes a step of obtaining a pattern (cured substance pattern) by the imprint pattern producing method according to the embodiment of the present invention, and a method for manufacturing a device including the circuit board. The method for manufacturing a circuit board according to the preferred embodiment of the present invention may further include a step of performing etching or ion implantation on the substrate using the pattern (cured substance pattern) obtained by the above-described pattern forming as a mask and a step of forming an electronic member. The above-described circuit board is preferably a semiconductor element. That is, the present invention discloses a method for manufacturing a semiconductor device, including the imprint pattern producing method according to the embodiment of the present invention. Further, the present invention discloses a method for manufacturing a device, which includes a step of obtaining a circuit board by the above-described method for manufacturing a circuit board and a step of connecting the circuit board and a control mechanism which controls the circuit board.

Moreover, by forming a grid pattern on a glass base material of a liquid crystal display device using the imprint pattern producing method according to the embodiment of the present invention, a polarizing plate having low reflection or absorption and a large screen size (for example, 55 inches, or greater than 60 inches) can be manufactured at a low cost. That is, the present invention discloses a method for manufacturing a polarizing plate and a method for manufacturing a device including the polarizing plate, which include the imprint pattern producing method according to the embodiment of the present invention. For example, the polarizing plate described in JP2015-132825A or WO2011/132649A can be manufactured. Furthermore, 1 inch is 25.4 mm.

The pattern (cured substance pattern) manufactured by the imprint pattern producing method according to the embodiment of the present invention is also useful as an etching resist (mask for lithography). That is, the present invention discloses a method for manufacturing a device in which the obtained cured substance pattern is used as an etching resist, including the imprint pattern producing method according to the embodiment of the present invention.

In a case where the cured substance pattern is used as an etching resist, examples thereof include an aspect in which, first, a pattern (cured substance pattern) is formed by applying the imprint pattern producing method according to the embodiment of the present invention on a base material, and the obtained cured substance pattern is used as an etching mask to etch the base material. By performing etching with an etching gas such as hydrogen fluoride or the like in a case of wet etching and $CF_4$ or the like in a case of dry etching, a pattern can be formed on the base material along the shape of the desired cured substance pattern.

Moreover, the pattern (cured substance pattern) produced by the imprint pattern producing method according to the embodiment of the present invention can be also preferably used for producing a recording medium such as a magnetic disc, a light-receiving element such as a solid-state imaging element, a light emitting element such as a light emitting diode (LED) and organic electroluminescence (organic EL), an optical device such as a liquid crystal display device (LCD), an optical component such as a diffraction grating, a relief hologram, an optical waveguide, an optical filter, and a microlens array, a member for flat panel display such as a thin film transistor, an organic transistor, a color filter, an antireflection film, a polarizing plate, a polarizing element, an optical film, and a column material, a nanobiodevice, an immunoassay chip, a deoxyribonucleic acid (DNA) separation chip, a microreactor, a photonic liquid crystal, or a guide pattern for fine pattern formation (directed self-assembly, DSA) using self-assembly of block copolymers.

That is, the present invention discloses a method for manufacturing these device, including the imprint pattern producing method according to the embodiment of the present invention.

<Composition for Forming Liquid Film>

In addition, in the present invention, it is also preferable that a liquid film is formed on the interlayer by using a composition for forming a liquid film containing a radically polymerizable compound which is a liquid at 23° C. and 1 atm. In the present invention, the liquid film can be obtained by applying the composition for forming a liquid film to the interlayer and then drying the composition, in the same manner as the composition for forming a pattern. By forming such a liquid film, there are effects that the adhesiveness between the interlayer and the composition for forming a pattern is further improved, and that the wettability of the composition for forming a pattern on the interlayer is also improved. Hereinafter, the composition for forming a liquid film will be described.

A viscosity of the composition for forming a liquid film is preferably 1,000 mPa·s or lower, more preferably 800 mPa·s or lower, still more preferably 500 mPa·s or lower, and even more preferably 100 mPa·s or lower. The lower limit value of the viscosity is not particularly limited, but can be, for example, 1 mPa·s or greater. The viscosity is measured according to the following method.

The viscosity is measured using an E-type rotational viscometer RE85L manufactured by TOKI SANGYO CO., LTD. and a standard cone rotor (1°34'×R24) in a state where a temperature of a sample cup is adjusted to 23° C. The unit is mPa·s. Other details regarding the measurement are in accordance with JIS Z 8803:2011. Two samples are produced for one level and are respectively measured three times. An arithmetic mean value of a total of six times is adopted as an evaluation value.

[Radically Polymerizable Compound A]

The composition for forming a liquid film contains a radically polymerizable compound (radically polymerizable compound A) which is a liquid at 23° C. and 1 atm.

A viscosity of the radically polymerizable compound A at 23° C. is preferably 1 to 100,000 mPa·s. The lower limit thereof is preferably 5 mPa·s or greater and more preferably 11 mPa·s or greater. The upper limit thereof is preferably 1,000 mPa·s or lower and more preferably 600 mPa·s or lower.

The radically polymerizable compound A may be a monofunctional radically polymerizable compound having only one radically polymerizable group in one molecule, or a polyfunctional radically polymerizable compound having two or more radically polymerizable groups in one molecule. The monofunctional radically polymerizable compound and the polyfunctional radically polymerizable compound may be used in combination. Among them, for a reason of suppressing pattern collapse, the radically polymerizable compound A contained in the composition for forming a liquid film preferably includes a polyfunctional radically polymerizable compound, more preferably includes a radically polymerizable compound having two to five radically polymerizable groups in one molecule, still more preferably includes a radically polymerizable compound having two to four radically polymerizable groups in one molecule, and particularly preferably includes a radically polymerizable compound having two radically polymerizable groups in one molecule.

Furthermore, the radically polymerizable compound A preferably contains at least one of an aromatic ring (the number of carbon atoms is preferably 6 to 22, more preferably 6 to 18, and still more preferably 6 to 10) or an alicyclic ring (the number of carbon atoms is preferably 3 to 24, more preferably 3 to 18, and still more preferably 3 to 6), and more preferably contains an aromatic ring. The aromatic ring is preferably a benzene ring. Moreover, a molecular weight of the radically polymerizable compound A is preferably 100 to 900.

Examples of the radically polymerizable group of the radically polymerizable compound A include ethylenically unsaturated bond-containing groups, such as a vinyl group, an allyl group, and a (meth)acryloyl group, and a (meth)acryloyl group is preferable.

It is also preferable that the radically polymerizable compound A is a compound represented by Formula (I-1).

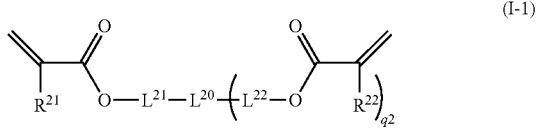

$L^{20}$ is a (1+q2)-valent linking group, and examples thereof include (1+q2)-valent linking groups which contains a group (the number of carbon atoms is preferably 1 to 12, more preferably 1 to 6, and still more preferably 1 to 3) having an alkane structure, a group (the number of carbon atoms is preferably 2 to 12, more preferably 2 to 6, and still more preferably 2 or 3) having an alkene structure, a group (the number of carbon atoms is preferably 6 to 22, more preferably 6 to 18, and still more preferably 6 to 10) having an aryl structure, a group (the number of carbon atoms is preferably 1 to 22, more preferably 1 to 18, and still more preferably 1 to 10, examples of a heteroatom include a nitrogen atom, a sulfur atom, and an oxygen atom, and a 5-membered ring, a 6-membered ring, or a 7-membered ring are preferable) having a heteroaryl structure, or a group obtained by combining these groups. Examples of the group in which two aryl groups are combined include groups having a structure such as biphenyl, diphenylalkane, biphenylene, and indene. Examples of a combination of the group having a heteroaryl structure and the group having an aryl structure include groups having a structure such as indole, benzimidazole, quinoxaline, and carbazole.

$L^{20}$ is preferably a linking group including at least one kind selected from a group having an aryl structure or a group having a heteroaryl structure, and more preferably a linking group including a group having an aryl structure.

$R^{21}$ and $R^{22}$ each independently represent a hydrogen atom or a methyl group.

$L^{21}$ and $L^{22}$ each independently represent a single bond or the linking group L, and a single bond or an alkylene group is preferable.

$L^{20}$ and $L^{21}$ or $L^{22}$ may be bonded to each other through or without through the linking group L to form a ring. $L^{20}$, $L^{21}$, and $L^{22}$ may have the above-described substituent T. A plurality of substituents T may be bonded to each other to form a ring. In a case where there are the plurality of substituents T, the plurality of substituents T may be the same as or different from each other.

q2 is an integer of 0 to 5, preferably an integer of 0 to 3, more preferably an integer of 0 to 2, still more preferably 0 or 1, and particularly preferably 1.

As the radically polymerizable compound A, the compounds described in paragraphs 0017 to 0024 and Examples of JP2014-090133A, the compounds described in paragraphs 0024 to 0089 of JP2015-009171A, the compounds described in paragraphs 0023 to 0037 of JP2015-070145A, and the compounds described in paragraphs 0012 to 0039 of WO2016/152597A can also be used.

A content of the radically polymerizable compound A in the composition for forming a liquid film is preferably 0.01% by mass or greater, more preferably 0.05% by mass or greater, and still more preferably 0.1% by mass or greater. The upper limit thereof is preferably 10% by mass or lower, more preferably 5% by mass or lower, and still more preferably 1% by mass or lower.

The content of the radically polymerizable compound A in the solid content of the composition for forming a liquid film is preferably 50% by mass or greater, more preferably 75% by mass or greater, and still more preferably 90% by mass or greater. The upper limit thereof may be 100% by mass. The radically polymerizable compound A may be used alone or in combination of two or more kinds thereof In a case where two or more kinds thereof are used, the total amount thereof is preferably within the above-described range.

Furthermore, it is also preferable that the solid content of the composition for forming a liquid film substantially consists of the radically polymerizable compound A. The case where the solid content of the composition for forming a liquid film substantially consists of the radically polymerizable compound A means that the content of the radically polymerizable compound A in the solid content of the composition for forming a liquid film is 99.9% by mass or greater, the content is more preferably 99.99% by mass or greater, and it is still more preferable that the solid content consists of the radically polymerizable compound A.

[Solvent]

The composition for forming a liquid film preferably contains a solvent (hereinafter, referred to as a "solvent for a liquid film" in some cases). Examples of the solvent for a liquid film include the solvents described in the above-described section of the solvent for the curable composition, and these solvents can be used. A content of the solvent for a liquid film in the composition for forming a liquid film is preferably 90% by mass or greater and more preferably 99% by mass or greater, and may be 99.99% by mass or greater.

A boiling point of the solvent for a liquid film is preferably 230° C. or lower, more preferably 200° C. or lower, still more preferably 180° C. or lower, even more preferably 160° C. or lower, and further still more preferably 130° C. or lower. The lower limit value thereof is preferably 23° C. or higher and more preferably 60° C. or higher. By setting the boiling point within the above-described range, the solvent can be easily removed from the liquid film, which is preferable.

[Radical Polymerization Initiator]

The composition for forming a liquid film may contain a radical polymerization initiator. Examples of the radical polymerization initiator include a thermal radical polymerization initiator and a photoradical polymerization initiator, and a photoradical polymerization initiator is preferable. As a photoradical polymerization initiator, well-known compounds can be optionally used. Examples thereof include a halogenated hydrocarbon derivative (for example, a compound having a triazine skeleton, a compound having an oxadiazole skeleton, a compound having a trihalomethyl group, and the like), an acylphosphine compound, a hexaarylbiimidazole compound, an oxime compound, an organic peroxide, a thio compound, a ketone compound, an aromatic onium salt, an acetophenone compound, an azo compound, an azide compound, a metallocene compound, an organic boron compound, and an iron arene complex. For the details thereof, reference can be made to the description in paragraphs 0165 to 0182 of JP2016-027357A, the contents of which are incorporated in the present specification. Among them, an acetophenone compound, an acylphosphine compound, or an oxime compound is preferable. Examples of a commercially available product thereof include IRGACURE-OXE01, IRGACURE-OXE02, IRGACURE-127, IRGACURE-819, IRGACURE-379, IRGACURE-369, IRGACURE-754, IRGACURE-1800, IRGACURE-651, IRGACURE-907, IRGACURE-TPO, and IRGACURE-1173 (all manufactured by BASF SE), and Omnirad 184, Omnirad TPO H, Omnirad 819, and Omnirad 1173 (all manufactured by IGM Resins B.V.).

In a case where the radical polymerization initiator is contained, the content thereof with respect to the solid content of the composition for forming a liquid film is preferably 0.1% to 10% by mass, more preferably 1% to 8% by mass, and still more preferably 2% to 5% by mass. In a case where two or more kinds of the radical polymerization initiators are used, the total amount thereof is preferably within the above-described range.

[Other Components]

The composition for forming a liquid film may include one or more kinds of a polymerization inhibitor, an antioxidant, a leveling agent, a thickener, a surfactant, or the like, in addition to the above-described components.

EXAMPLES

Hereinafter, the present invention will be described in more detail with reference to Examples. The materials, the used amounts, the proportions, the treatment details, the treatment procedures, and the like shown in the following Examples can be appropriately modified without departing from the spirit of the present invention. Therefore, the scope of the present invention is not limited to the specific examples described below. In Examples, unless otherwise specified, "parts" and "%" are based on mass, and an environmental temperature (room temperature) in each step is 23° C.

<Preparation of Curable Composition>

In each Example and each Comparative Example, each component described in the column of "Curable composition" in Tables 1 to 6 was mixed.

The content of each component other than a solvent is a content (part by mass) shown in Tables 1 to 6, and as for the content of the solvent, the concentration of solid contents of each composition is set to the value described in the column of "Concentration of solid contents (% by mass)" in Tables 1 to 6. The numerical value described in the column of "Content ratio" in "Solvent" is a content ratio (% by mass) of each solvent, and the description of "100" means that the solvent was used alone. Moreover, in each composition, a component described as "-" was not added.

In Tables 1 to 6, for example, for the example in which the column of "Content" of "A-1/A-6" in the column of "Type" of "Polymerization inhibitor" is described as "150/150", it is shown that 150 parts by mass of A-1 and 150 parts by mass of A-6 were used as the polymerization inhibitor.

The mixture of each component was filtered through a nylon filter having a pore diameter of 0.02 μm and a polytetrafluoroethylene filter having a pore diameter of 0.001 μm to prepare a curable composition or a comparative composition.

TABLE 1

| | | | Example | | | | | | | |
|---|---|---|---|---|---|---|---|---|---|---|
| | | | 1 | 2 | 3 | 4 | 5 | 6 | 7 | 8 |
| Curable composition | Curable main agent | Type | P-1 | P-1 | P-1 | P-1 | P-1 | P-1 | P-17 | P-1 |
| | | Content | 100 | 100 | 100 | 100 | 100 | 100 | 100 | 100 |
| | Polymerization inhibitor | Type | A-1 | A-2 | A-3 | A-1 | A-1 | A-1 | A-1 | A-1 |
| | | Content | 150 | 150 | 15 | 950 | 500 | 3 | 150 | 150 |
| | Additive | Type | — | — | — | — | — | — | — | — |
| | | Content | — | — | — | — | — | — | — | — |
| | Solvent | Type | PGMEA | PGMEA | PGMEA | PGMEA | PGMEA | PGMEA | PGMEA | PGMEA |
| | | Content ratio | 100 | 100 | 100 | 100 | 100 | 100 | 100 | 100 |
| | Concentration of solid contents | | 0.3 | 0.3 | 0.2 | 0.3 | 0.3 | 0.3 | 0.3 | 25 |
| | Amount of polymerization inhibitor in interlayer | | 5 | 140 | 15 | 300 | 250 | 0.1 | 5 | 13 |
| | Solution stability | | A | A | A | A | A | A | A | A |
| | Defects after pattern formation | | A | A | B | A | A | A | A | A |

TABLE 2

| | | | Example | | | | | | | |
|---|---|---|---|---|---|---|---|---|---|---|
| | | | 9 | 10 | 11 | 12 | 13 | 14 | 15 | 16 |
| Curable composition | Curable main agent | Type | P-1 | P-1 | P-1 | P-1 | P-1 | P-1 | P-1 | P-1 |
| | | Content | 100 | 100 | 100 | 100 | 100 | 100 | 100 | 100 |
| | Polymerization inhibitor | Type | A-4 | A-5 | A-6 | A-7 | A-8 | A-9 | A-10 | A-11 |
| | | Content | 150 | 150 | 150 | 150 | 150 | 150 | 150 | 150 |
| | Additive | Type | — | B-1 | — | B-2 | — | — | — | — |
| | | Content | — | 15000 | — | 10000 | — | — | — | — |

TABLE 2-continued

|  |  | Example | | | | | | | |
|---|---|---|---|---|---|---|---|---|---|
|  |  | 9 | 10 | 11 | 12 | 13 | 14 | 15 | 16 |
| Solvent | Type | PGMEA | PGMEA | PGMEA | PGMEA | PGMEA | PGMEA | PGMEA | PGMEA |
|  | Content ratio | 100 | 100 | 100 | 100 | 100 | 100 | 100 | 100 |
| Concentration of solid contents | | 0.3 | 0.3 | 0.3 | 0.3 | 0.1 | 0.05 | 1 | 0.2 |
| Amount of polymerization inhibitor in interlayer | | 8 | 5 | 10 | 8 | 5 | 5 | 80 | 60 |
| Solution stability | | A | A | A | A | A | A | A | A |
| Defects after pattern formation | | A | A | A | A | A | A | A | A |

TABLE 3

|  |  |  | Example | | | | | | | |
|---|---|---|---|---|---|---|---|---|---|---|
|  |  |  | 17 | 18 | 19 | 20 | 21 | 22 | 23 | 24 |
| Curable composition | Curable main agent | Type | P-1 | P-2 | P-3 | P-4 | P-5 | P-6 | P-7 | P-8 |
|  |  | Content | 100 | 100 | 100 | 100 | 100 | 100 | 100 | 100 |
|  | Polymerization inhibitor | Type | A-12 | A-1/A-6 | A-13 | A-1/A-6 | A-1/A-6 | A-13 | A-1/A-14 | A-13 |
|  |  | Content | 150 | 150/150 | 150 | 150/150 | 150/150 | 150 | 150/150 | 150 |
|  | Additive | Type | — | — | — | — | — | — | — | — |
|  |  | Content | — | — | — | — | — | — | 0 | — |
|  | Solvent | Type | PGMEA | PGMEA | PGMEA | PGMEA | PGMEA | PGMEA/PGME/EL | PGMEA | PGMEA |
|  |  | Content ratio | 100 | 100 | 100 | 100 | 100 | 40/40/20 | 100 | 100 |
| Concentration of solid contents | | | 0.3 | 0.3 | 0.3 | 0.3 | 0.3 | 0.3 | 0.3 | 0.3 |
| Amount of polymerization inhibitor in interlayer | | | 120 | 5/10 | 5 | 5/10 | 5/10 | 5 | 5/110 | 5 |
| Solution stability | | | A | A | A | A | A | A | A | A |
| Defects after pattern formation | | | B | A | A | A | A | A | A | A |

TABLE 4

|  |  |  | Example | | | | | | | |
|---|---|---|---|---|---|---|---|---|---|---|
|  |  |  | 25 | 26 | 27 | 28 | 29 | 30 | 31 | 32 |
| Curable composition | Curable main agent | Type | P-9 | P-10 | P-11 | P-12 | P-13 | P-14 | P-15 | P-16 |
|  |  | Content | 100 | 100 | 100 | 100 | 100 | 100 | 100 | 100 |
|  | Polymerization inhibitor | Type | A-15/A-14 | A-13 | A-13 | A-13 | A-9 | A-8 | A-4 | A-9 |
|  |  | Content | 150/150 | 150 | 150 | 150 | 150 | 150 | 150 | 150 |
|  | Additive | Type | — | — | B-3 | — | — | — | — | — |
|  |  | Content | — | — | 2000 | — | — | — | — | — |
|  | Solvent | Type | PGMEA | PGMEA | PGMEA | PGMEA | PGMEA | PGMEA | PGMEA/PGME | PGMEA |
|  |  | Content ratio | 100 | 100 | 100 | 100 | 100 | 100 | 60/40 | 100 |
| Concentration of solid contents | | | 5 | 0.3 | 0.3 | 0.3 | 0.3 | 0.3 | 0.3 | 0.3 |
| Amount of polymerization inhibitor in interlayer | | | 100/110 | 5 | 5 | 5 | 8 | 5 | 8 | 5 |
| Solution stability | | | A | A | A | A | A | A | A | A |
| Defects after pattern formation | | | A | A | A | A | A | A | A | A |

TABLE 5

|  |  |  | Example | | | | | | | |
|---|---|---|---|---|---|---|---|---|---|---|
|  |  |  | 33 | 34 | 35 | 36 | 37 | 38 | 39 | 40 |
| Curable composition | Curable main agent | Type | P-17 | P-18 | P-19 | P-20 | P-21 | P-22 | P-23 | P-24 |
|  |  | Content | 100 | 100 | 100 | 100 | 100 | 100 | 100 | 100 |
|  | Polymerization inhibitor | Type | A-4 | A-9 | A-9 | A-4 | A-5 | A-9 | A-8 | A-5 |
|  |  | Content | 150 | 150 | 150 | 150 | 150 | 150 | 150 | 150 |
|  | Additive | Type | — | — | — | — | — | B-4 | — | — |
|  |  | Content | — | — | — | — | — | 1000 | — | — |

TABLE 5-continued

|  |  | Example | | | | | | | |
|---|---|---|---|---|---|---|---|---|---|
|  |  | 33 | 34 | 35 | 36 | 37 | 38 | 39 | 40 |
| Solvent | Type | PGMEA | PGME/GBL | PGMEA | PGMEA | PGMEA | PGMEA | PGMEA | PGMEA |
|  | Content ratio | 100 | 40/60 | 100 | 100 | 100 | 100 | 100 | 100 |
| Concentration of solid contents | | 0.3 | 0.3 | 0.3 | 0.3 | 0.3 | 0.3 | 0.3 | 0.3 |
| Amount of polymerization inhibitor in interlayer | | 8 | 5 | 5 | 8 | 4 | 5 | 5 | 5 |
| Solution stability | | A | A | A | A | A | A | A | A |
| Defects after pattern formation | | A | A | A | A | A | A | A | A |

TABLE 6

|  |  |  | Example | | | | | | | | | Comparative Example | |
|---|---|---|---|---|---|---|---|---|---|---|---|---|---|
|  |  |  | 41 | 42 | 43 | 44 | 45 | 46 | 47 | 48 | 49 | 1 | 2 |
| Curable composition | Curable main agent | Type | P-25 | P-26 | P-27 | P-28 | P-29 | P-30 | P-1 | P-31 | P-32 | P-1 | P-1 |
|  |  | Content | 100 | 100 | 100 | 100 | 100 | 100 | 100 | 100 | 100 | 100 | 100 |
|  | Polymerization inhibitor | Type | A-9 | A-8 | A-5 | A-9 | A-8 | A-16 | A-1 | A-9 | A-8 | A-1 | — |
|  |  | Content | 150 | 150 | 150 | 150 | 150 | 150 | 150 | 150 | 150 | 1500 | — |
|  | Additive | Type | — | — | — | — | — | — | B-5 | — | — | — | — |
|  |  | Content | — | — | — | — | — | — | 1500 | — | — | — | — |
|  | Solvent | Type | PGMEA | PGME/GBL | PGMEA/EL | PGME/EL/GBL | PGMEA | PGMEA | PGMEA | PGMEA | PGMEA | PGMEA | PGMEA |
|  |  | Content ratio | 100 | 80/20 | 70/30 | 45/40/15 | 100 | 100 | 100 | 100 | 100 | 100 | 100 |
| Concentration of solid contents | | | 0.3 | 0.3 | 0.3 | 0.3 | 0.3 | 0.3 | 0.3 | 0.3 | 0.3 | 0.3 | 0.3 |
| Amount of polymerization inhibitor in interlayer | | | 5 | 5 | 5 | 5 | 5 | 15 | 5 | 8 | 5 | 1000 | 0 |
| Solution stability | | | A | A | A | A | A | A | A | A | A | A | B |
| Defects after pattern formation | | | A | A | A | A | A | A | A | A | A | C | A |

Details of each of the components listed in Tables 1 to 6 are as follows.

[Curable Main Agent]

P-1 to P-32: polymer compounds consisting of repeating units having the following structures; * represents a bonding site with other repeating units; subscripts such as m, n, a, b, and c described in a main chain represent a content molar ratio of each repeating unit, and details of a, b, and c are shown in Table 7; a numerical value which is a subscript in parentheses attached to a side chain represents an arithmetic mean value of the repetition number of each repeating unit.

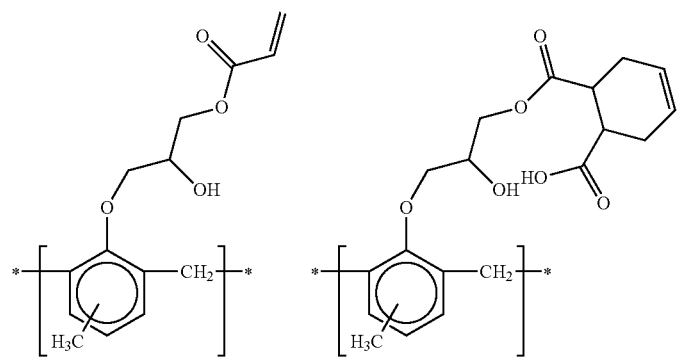

P-1

(Isorad501, manufactured by Schenectady International Inc.)

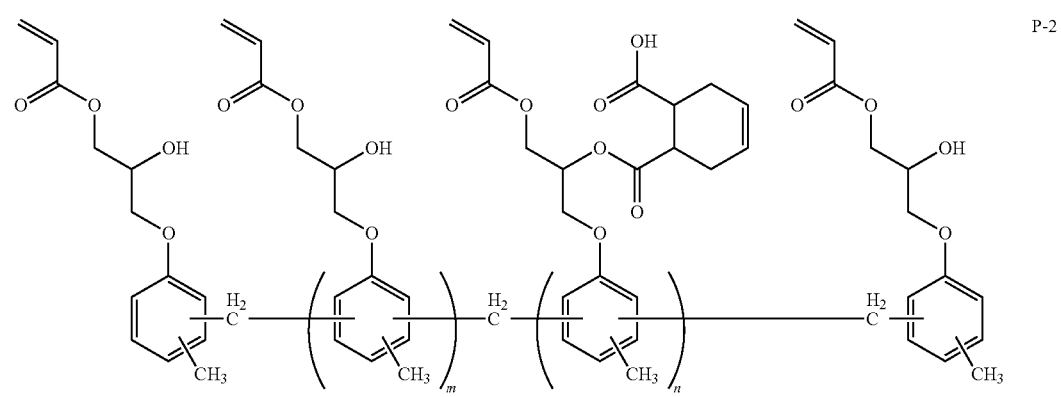
P-2
average m + n = 11, average n/(m + n) = 0.5
manufactured by Shin-Nakamura Chemical Co., Ltd., NK OLIGO EA-7440
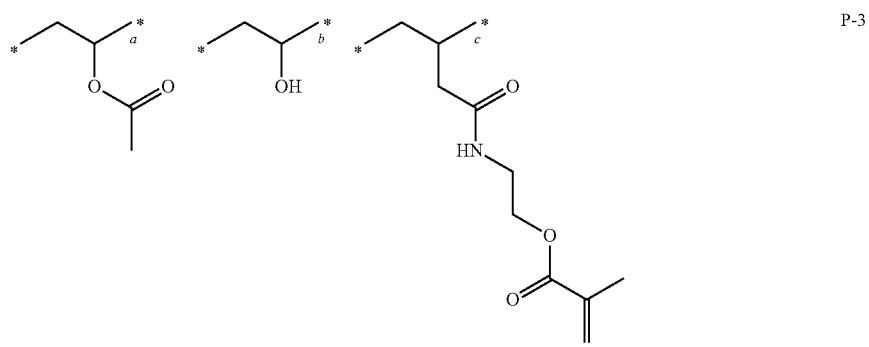
P-3
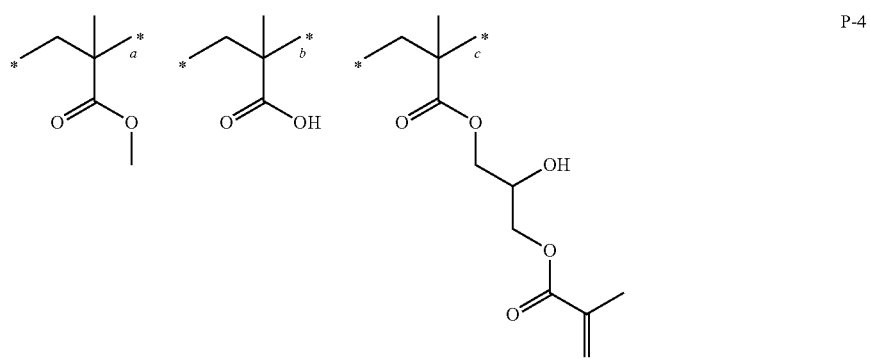
P-4
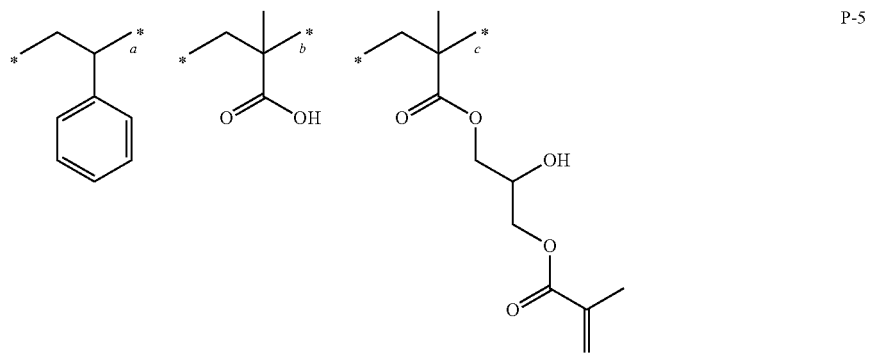
P-5

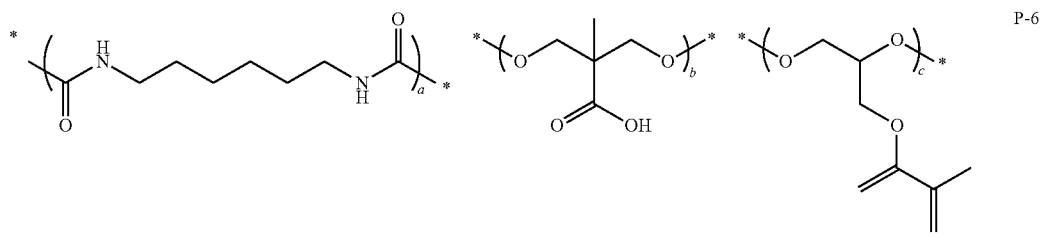
P-6
a/b/c (molar ratio) = 50/20/30
a/b/c (mass ratio) = 53/17/30
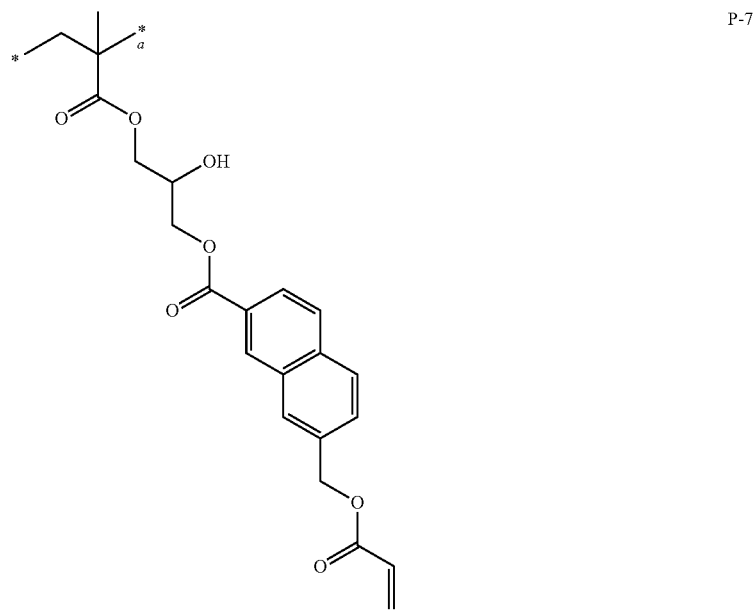
P-7
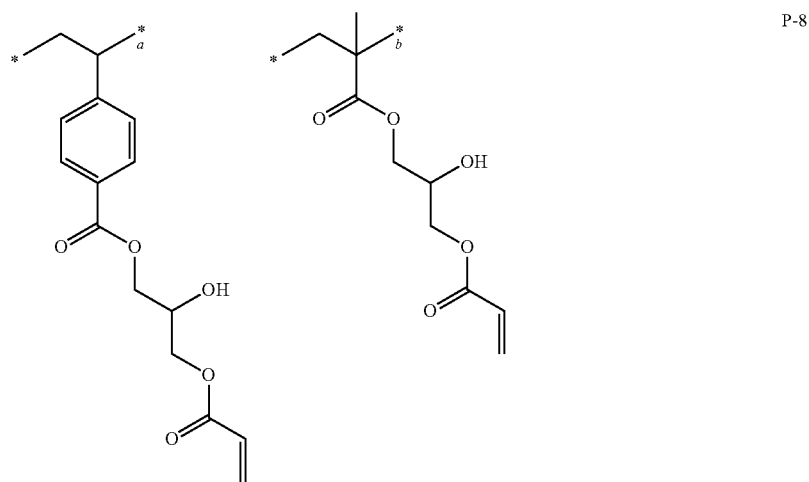
P-8

-continued
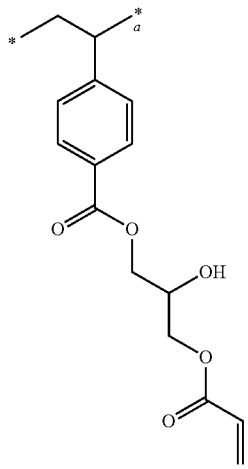 [SMILES: C=CC(=O)OCC(O)COC(=O)c1ccc(C(C)CC)cc1]
P-9
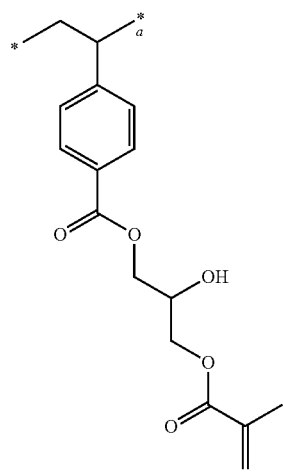 [SMILES: C=C(C)C(=O)OCC(O)COC(=O)c1ccc(C(C)CC)cc1]
P-10
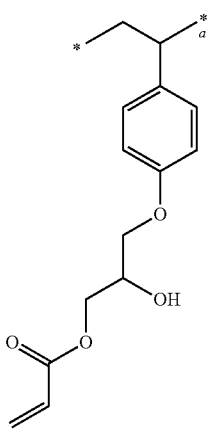 [SMILES: C=CC(=O)OCC(O)COc1ccc(C(C)CC)cc1]
P-11

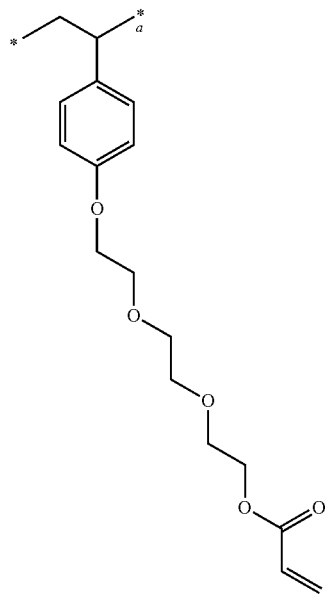 [SMILES: C=CC(=O)OCCOCCOCCOc1ccc(C(C)CC)cc1]
P-12
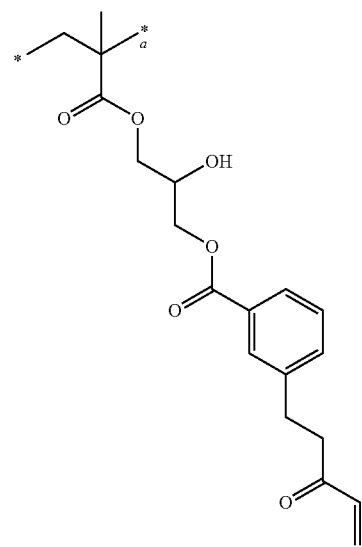 [SMILES: C=CC(=O)CCc1cccc(C(=O)OCC(O)COC(=O)C(C)(C)CC)c1]
P-13
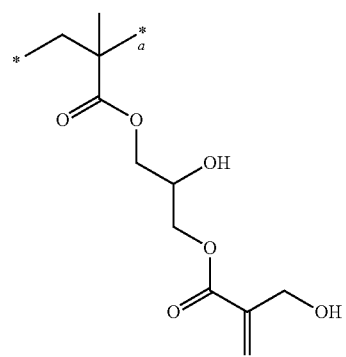 [SMILES: C=C(CO)C(=O)OCC(O)COC(=O)C(C)(C)CC]
P-14

-continued
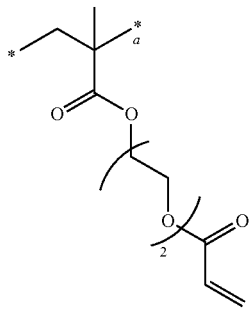
P-15
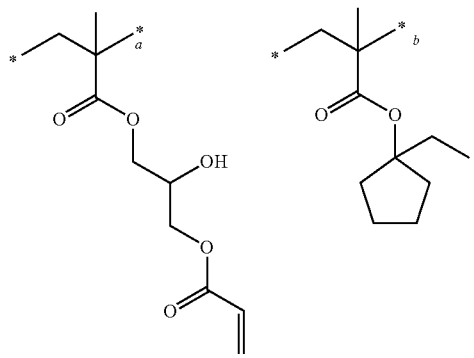
P-16
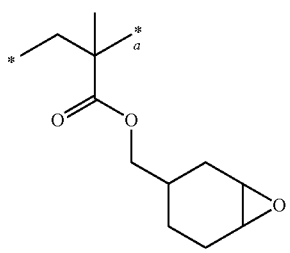 [SMILES: CCC(C)(C)C(=O)OCC1CCC2OC2C1]
P-17
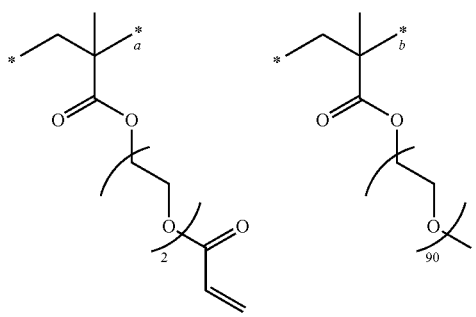
P-18
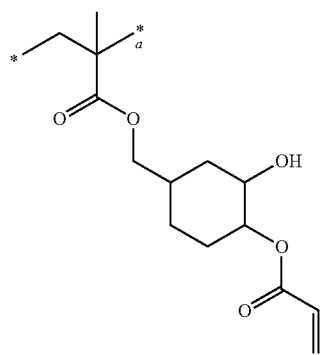 [SMILES: C=CC(=O)OC1CCC(COC(=O)C(C)(C)CC)CC1O]
P-19

-continued
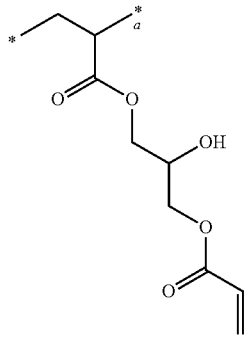 [SMILES: C=CC(=O)OCC(O)COC(=O)C(C)CC]
P-20
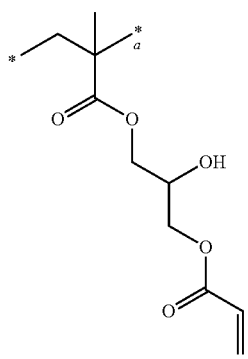 [SMILES: C=CC(=O)OCC(O)COC(=O)C(C)(C)CC]
P-21
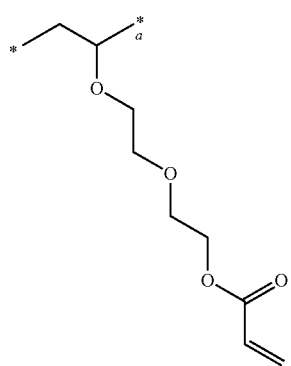
P-22
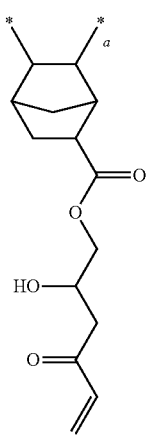 [SMILES: C=CC(=O)CC(O)COC(=O)C1CC2CC1C(C)C2C]
P-23

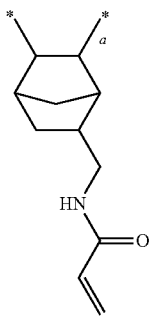
P-24
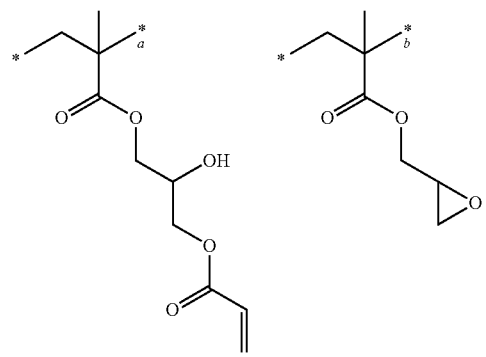 [SMILES: C=CC(=O)OCC(O)COC(=O)C(C)(C)CC ; CCC(C)(C)C(=O)OCC1CO1]
P-25
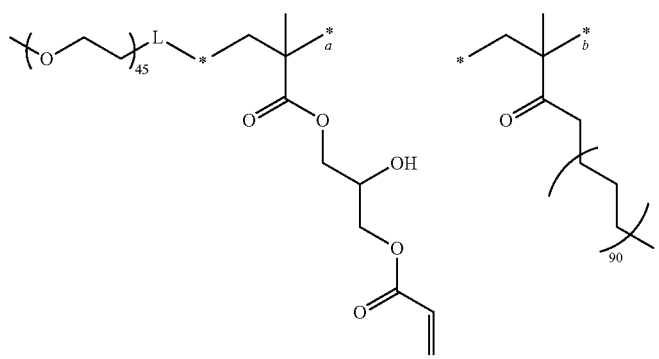
P-26
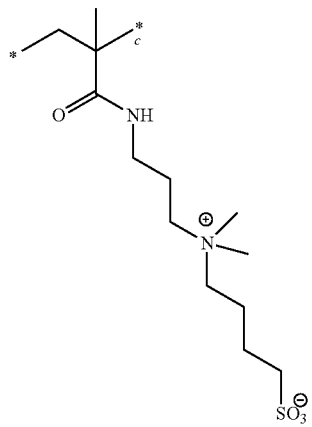

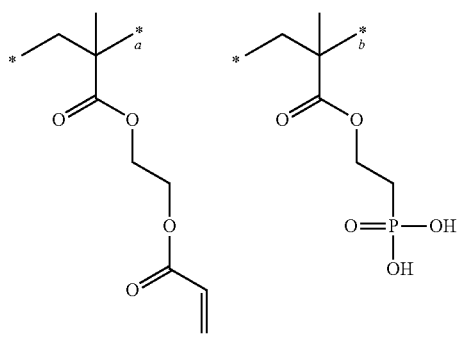
P-27
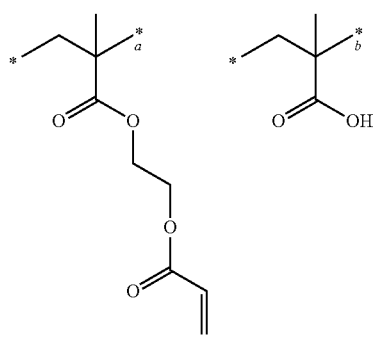
P-28
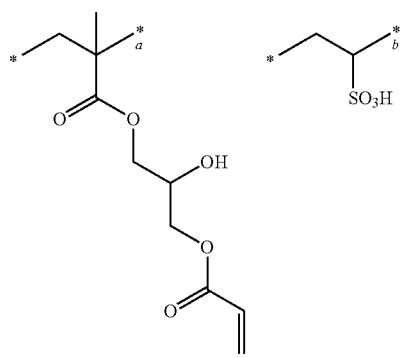
P-29
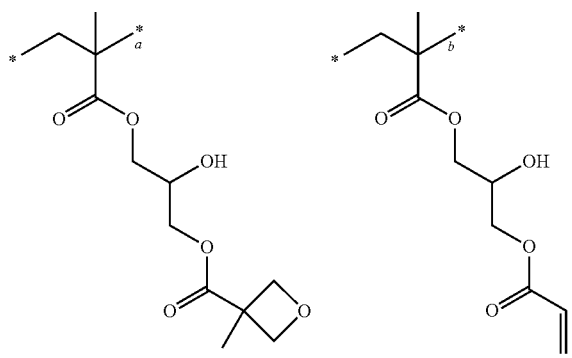
P-30

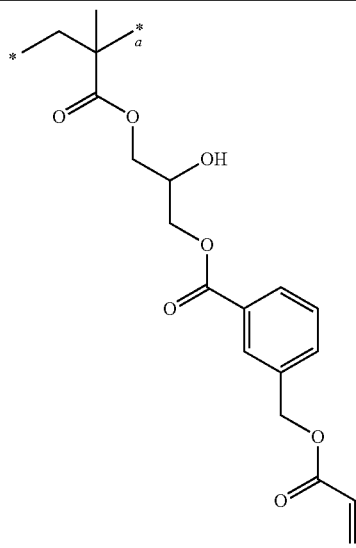
P-31
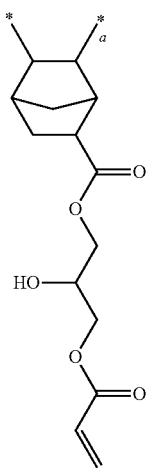 [SMILES: C=CC(=O)OCC(O)COC(=O)C1CC2CC1C(C)C2C]
P-32
In P-26 described above, L is a structure derived from the following initiator.
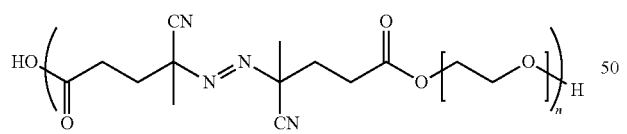
TABLE 7
| Resin | Weight-average molecular weight | a | b | c |
|---|---|---|---|---|
| P-2 | 4000 | — | — | — |
| P-3 | 20000 | 20 | 10 | 70 |
| P-4 | 15000 | 35 | 5 | 60 |
| P-5 | 20000 | 10 | 1 | 89 |
| P-6 | 40000 | 50 | 20 | 30 |
| P-7 | 20000 | 100 | — | — |
| P-8 | 50000 | 50 | 50 | — |
TABLE 7-continued
| Resin | Weight-average molecular weight | a | b | c |
|---|---|---|---|---|
| P-9 | 20000 | 100 | — | — |
| P-10 | 20000 | 100 | — | — |
| P-11 | 20000 | 100 | — | — |
| P-12 | 10000 | 100 | — | — |
| P-13 | 30000 | 100 | — | — |
| P-14 | 6000 | 100 | — | — |
| P-15 | 20000 | 100 | — | — |
| P-16 | 35000 | 50 | 50 | — |
| P-17 | 20000 | 100 | — | — |
| P-18 | 50000 | 90 | 10 | — |
| P-19 | 20000 | 100 | — | — |
| P-20 | 20000 | 100 | — | — |
| P-21 | 20000 | 100 | — | — |
| P-22 | 20000 | 100 | — | — |
| P-23 | 20000 | 100 | — | — |
| P-24 | 20000 | 100 | — | — |
| P-25 | 110000 | 40 | 60 | — |
| P-26 | 75000 | 85 | 10 | 5 |
| P-27 | 20000 | 95 | 5 | — |
| P-28 | 5000 | 70 | 30 | — |
| P-29 | 20000 | 95 | 5 | — |

TABLE 7-continued

| Resin | Weight-average molecular weight | a | b | c |
|---|---|---|---|---|
| P-30 | 20000 | 60 | 40 | — |
| P-31 | 30000 | 100 | — | — |
| P-32 | 20000 | 100 | — | — |

[Polymerization Inhibitor]
- A-1: 4-methoxyphenol
- A-2: N-nitroso-N-phenylhydroxylamine aluminum
- A-3: poly(4-methacryloyloxy-2,2,6,6-tetramethylpiperidin-N-oxyl)
- A-4: 4-tert-butylcatechol
- A-5: 1,4-benzoquinone
- A-6: phenothiazine
- A-7: N,N-diethylhydroxylamine
- A-8: 4-hydroxy-2,2,6,6-tetramethylpiperidine 1-oxyl
- A-9: cupferron
- A-10: 2,2-diphenyl-1-picrylhydrazyl
- A-11: triphenyl phthalazinyl
- A-12: pentaerythritol tetrakis[3-(3,5-di-tert-butyl-4-hydroxyphenyl)propionate]
- A-13: 2,2,6,6-tetramethylpiperidine 1-oxyl
- A-14: tris(2,4-di-tert-butylphenyl) phosphite
- A-15: dioctadecyl 3,3'-thiodipropionate
- A-16: 2,4-bis(octylthiomethyl)-6-methylphenol

[Additive]
- B-1: hexamethoxymethylmelamine
- B-2: paratoluenesulfonic acid
- B-3: dipentaerythritol hexaacrylate
- B-4: phenylbis(2,4,6-trimethylbenzoyl)phosphine oxide
- B-5: (2-ethylhexanoyl)(tert-butyl)peroxide

[Solvent]
- PGMEA: propylene glycol monomethyl ether acetate
- PGME: propylene glycol monomethyl ether
- EL: ethyl lactate
- GBL: γ-butyrolactone <Preparation of Composition for Forming Pattern>

Compounds shown in Table 8 below were formulated in a formulation proportion (part by mass) shown in the table below, and 4-hydroxy-2,2,6,6-tetramethylpiperidine-1-oxyl free radical (manufactured by Tokyo Chemical Industry Co., Ltd.) as a polymerization inhibitor was further added thereto so that an amount thereof was 200 ppm by mass (0.02% by mass) with respect to an amount of the polymerizable compound (in compositions V-1 and V-2 for forming a pattern, the total amount of No. 1 to No. 3 in the table, and in a composition V-3 for forming a pattern, an amount of No. 1), thereby preparing compositions V-1 to V-3 for forming a pattern. The mixture was filtered with a nylon filter having a pore diameter of 0.02 μm and an UPE filter having a pore diameter of 0.001 μm to prepare the compositions V-1 to V-3 for forming a pattern. In the table, k+m+n is 10.

TABLE 8

| No. | Composition V-1 for forming pattern Compound | Formulation ratio (parts by mass) | Composition V-2 for forming pattern Compound | Formulation ratio (parts by mass) |
|---|---|---|---|---|
| 1 | benzene-1,3-diylbis(methylene) diacrylate | 65 | hexane-1,6-diyl diacrylate | 50 |
| 2 | dodecyl acrylate ($C_{12}H_{25}O$-acrylate) | 20 | benzyl acrylate | 40 |
| 3 | 2,2-dimethylpropane-1,3-diyl diacrylate | 15 | isobornyl acrylate | 10 |

TABLE 8-continued

| 4 | [bis(2,4,6-trimethylbenzoyl)phenylphosphine oxide structure] | 2 | | [2,4,6-trimethylbenzoyl phenylphosphinic acid ethyl ester structure] | 1 |
|---|---|---|---|---|---|
| 5 | [2-hydroxy-2-methyl-1-phenyl-propan-1-one structure] | 2 | | [2-hydroxy-2-methyl-1-phenyl-propan-1-one structure] | 2 |
| 6 | H$_3$CO(C$_3$H$_6$O)$_k$—[—(OC$_3$H$_6$)$_m$OCH$_3$ / (OC$_3$H$_6$)$_n$OCH$_3$] | 3 | | Fluorine-based surfactant Capstone FS-3100 (manufactured by DuPont) | 2 |

Composition V-3 for forming pattern

| No. | Compound | Formulation ratio (parts by mass) |
|---|---|---|
| 1 | [silicone polymer] | 24 |
| 2 | [2,4,6-trimethylbenzoyl phenylphosphinic acid ethyl ester structure] | 2 |
| 3 | [2-hydroxy-2-methyl-1-phenyl-propan-1-one structure] | 1 |
| 4 | Fluorine-based surfactant Capstone FS-3100 (manufactured by DuPont) | 2 |
| 5 | PGMEA | 70 |

[Synthesis of Silicone Polymer 1]

A silicone resin X-40-9225 (trade name, manufactured by Shin-Etsu Chemical Co., Ltd.) (10 parts), 2-hydroxyethyl acrylate (58.1 parts), and paratoluene sulfonic acid monohydrate (0.034 parts) were mixed with each other, and then the mixture was heated at 120° C. and stiffed for 3 hours while distilling off methanol produced by a condensation reaction to obtain 48 parts of a silicone polymer 1.

<Evaluation>

For each composition for forming a pattern of Examples and Comparative Examples described above, the following items were evaluated. Moreover, the illuminance of the ultra-high pressure mercury lamp was measured using ACCUMULATED UV METER UIT-250 manufactured by Ushio Inc.

[Measurement of Amount of Polymerization Inhibitor in Interlayer]

In each Example and Comparative Example, the prepared curable composition or comparative composition was each spin-coated on a silicon wafer, and was heated for 1 minute using a hot plate at 250° C. to form an interlayer (closely attached layer for an imprint lithography) having a thickness of 5 nm.

The interlayer was scraped off and dissolved in a solvent same as the solvent contained in the curable composition or the comparative composition used to prepare a sample, the content of each polymerization inhibitor contained in the interlayer was measured by high performance liquid chromatography, and the content (part by mass) of the polymerization initiator in the interlayer with respect to 1,000,000 parts by mass of components, excluding the polymerization inhibitor, was calculated. The measurement results are shown in the column of "Amount of polymerization inhibitor in interlayer" in Tables 1 to 6.

[Evaluation of Pattern Defects (Resolution)]

In each Example and Comparative Example, the prepared curable composition or comparative composition was each spin-coated on a silicon wafer, and was heated for 1 minute using a hot plate at 250° C. to form an interlayer (closely attached layer for an imprint lithography) having a thickness of 5 nm.

Moreover, the above-described composition V-1 for forming a pattern was applied to the above-described interlayer using an ink jet device (INK JET PRINTER DMP-2831 manufactured by FUJIFILM Dimatix Inc.) to form a curable layer. The thickness of the curable layer was 50 nm. An ejected amount from the ink jet device was 1 pL per nozzle. Thereafter, a mold for imprinting was pressed against the silicon wafer from the side of the above-described curable layer under a helium atmosphere. The used mold for imprinting was a quartz mold with line/space having a line width of 15 nm, a depth of 40 nm, and a pitch of 30 nm.

Thereafter, while the above-described mold for imprinting was pressed against the silicon wafer, exposure was performed from a side of the mold for imprinting through the mold for imprinting using an ultra-high pressure mercury lamp under the following two conditions, a condition A and a condition B, and the mold was released to obtain a pattern consisting of the cured substance of the composition for forming a pattern.

TABLE 9

| | Illuminance at each wavelength [mW/cm$^2$] | | | Exposure time (sec) |
|---|---|---|---|---|
| | 313 nm | 365 nm | 405 nm | |
| Condition A | 500 | 680 | 570 | 0.2 |
| Condition B | 1000 | 1350 | 1150 | 0.1 |

Using a defect review classifying device (RS-5500 manufactured by Hitachi High-Tech Fielding Corporation), scanning electron microscope (SEM) observation was performed at 500 places in the line/space area of the pattern consisting of the cured substance. Moreover, a proportion (defect generation rate) R (%) at which pattern defects were generated was derived by the following expression, and a degree of suppression of pattern defects (goodness of resolution) was evaluated according to the following evaluation standard. The evaluation results are described in the column of "Defects after pattern formation" in Tables 1 to 6. It can be said that, as the R (%) is smaller, the generation of pattern defects is suppressed.

Defect generation rate R (%)=[Total number of places where pattern defects were observed as result of SEM observation]/[Total number (500 in case of present example) of places where SEM observation was performed]×100

—Evaluation Standard—

A: defect generation rate R described above was 0% (that is, no collapse defect was confirmed, and the resolution was good).

B: defect generation rate R described above was greater than 0% and 1% or lower.

C: defect generation rate R described above was greater than 1%.

Moreover, in each Example and Comparative Example, even in a case where the pattern defects were evaluated by the same method as described above, except that the above-described composition V-1 for forming a pattern was changed to the composition V-2 for forming a pattern, the evaluation results of the pattern defects in each Example and Comparative Example were the same.

Further, in each Example and Comparative Example, even in a case where the pattern defects were evaluated by the same method as described above, except that the above-described composition V-1 for forming a pattern was changed to the composition V-3 for forming a pattern, and instead of forming the curable layer using the ink jet device, the above-described composition V-3 for forming a pattern was applied by a spin coating method and then heated and dried at 60° C. for 5 minutes to form a curable layer having a thickness of 80 nm, the evaluation results of the pattern defects in each Example and Comparative Example were the same.

[Evaluation of Solution Stability]

For the curable composition or the comparative composition prepared in each Example and Comparative Example, each composition was stored under the condition of 45° C. for 4 weeks, and a turbidity was measured. The turbidity was measured using an integrating sphere type turbidity meter PT-200 manufactured by Mitsubishi Chemical Analytech Co., Ltd.

From the measured turbidity, a solution stability was evaluated according to the following evaluation standard. The evaluation results are described in the column of "Solution stability" in Tables 1 to 6. It can be said that, as the above-described turbidity is smaller, the solution stability is excellent.

—Evaluation Standard—

A: turbidity was lower than 0.1 ppm.

B: turbidity was 0.1 ppm or greater.

From the above results, it is found that the curable composition including a curable main agent having a polymerizable functional group, a polymerization inhibitor, and a solvent, in which a content of the polymerization inhibitor is 1 part by mass or greater and lower than 1,000 parts by mass with respect to 1,000,000 parts by mass of the curable main agent, has high solution stability, and the generation of pattern defects in the curable layer formed on the interlayer formed of the composition is suppressed.

In the composition according to Comparative Example 1, the content of the polymerization inhibitor was 1,500 parts by mass with respect to 1,000,000 parts by mass of the curable main agent. In a case where such a composition is used, it is found that the pattern defects were generated in the curable layer formed on the interlayer.

The composition according to Comparative Example 2 did not contain the polymerization inhibitor. In a case where such a composition is used, it is found that the solution stability is deteriorated.

Moreover, the interlayer was formed on the silicon wafer using the curable composition according to each Example, and a predetermined pattern corresponding to a semiconductor circuit was formed on the silicon wafer with the interlayer using the composition for forming a pattern according to each Example. Moreover, each silicon wafer was dry-etched by using this pattern as an etching mask, and each semiconductor element was manufactured using this silicon wafer. There was no problem with the performance of any of the semiconductor elements. Further, using the curable composition and composition for forming a pattern of Example 1, a semiconductor element was manufactured on a substrate having a spin-on carbon (SOC) layer by the same procedure as described above. There was no problem with the performance of this semiconductor element as well.

What is claimed is:

1. A curable composition used for forming an interlayer existing between a base material and a curable layer, the curable composition comprising:
    a curable main agent having a polymerizable functional group;
    a polymerization inhibitor, wherein the polymerization inhibitor includes at least one compound selected from the group consisting of a phenol-based compound, a quinone-based compound, a free radical-based compound, an amine-based compound, and a phosphine-based compound, and has a molecular weight of 1,000 or less; and
    a solvent,
    wherein a content of the polymerization inhibitor is 200 parts by mass or greater and lower than 1,000 parts by mass with respect to 1,000,000 parts by mass of the curable main agent.

2. The curable composition according to claim 1, wherein the content of the polymerization inhibitor is 900 parts by mass or lower with respect to 1,000,000 parts by mass of the curable main agent.

3. A kit comprising:
    the curable composition according to claim 1; and
    a composition for forming a pattern, which includes a polymerizable compound.

4. An interlayer formed from the curable composition according to claim 1.

5. A laminate comprising:
    a base material; and
    an interlayer formed from the curable composition according to claim 1.

6. A curable composition used for forming an interlayer existing between a base material and a curable layer, the curable composition comprising:
    a curable main agent having a polymerizable functional group;
    a polymerization inhibitor, wherein the polymerization inhibitor includes at least one compound selected from the group consisting of a phenol-based compound, a quinone-based compound, a free radical-based compound, an amine-based compound, and a phosphine-based compound, and has a molecular weight of 1,000 or less; and
    a solvent,
    wherein a content of the polymerization inhibitor is 150 parts by mass or greater and lower than 1,000 parts by mass with respect to 1,000,000 parts by mass of the curable main agent.

7. The curable composition according to claim 1, wherein the content of the polymerization inhibitor is 800 parts by mass or lower with respect to 1,000,000 parts by mass of the curable main agent.

* * * * *